US010580796B2

(12) United States Patent
Okamoto et al.

(10) Patent No.: US 10,580,796 B2
(45) Date of Patent: Mar. 3, 2020

(54) DISPLAY DEVICE

(71) Applicant: Semiconductor Energy Laboratory Co., ltd., Kanagawa-ken (JP)

(72) Inventors: Satohiro Okamoto, Kanagawa (JP); Yasuyuki Arai, Kanagawa (JP); Ikuko Kawamata, Kanagawa (JP); Atsushi Miyaguchi, Kanagawa (JP); Yoshitaka Moriya, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 15/982,516

(22) Filed: May 17, 2018

(65) Prior Publication Data

US 2018/0270959 A1    Sep. 20, 2018

Related U.S. Application Data

(63) Continuation of application No. 15/210,097, filed on Jul. 14, 2016, now Pat. No. 9,980,389, which is a
(Continued)

(30) Foreign Application Priority Data

May 2, 2009    (JP) ................. 2009-112378

(51) Int. Cl.
*H01L 27/12* (2006.01)
*G02F 1/1333* (2006.01)
(Continued)

(52) U.S. Cl.
CPC ...... *H01L 27/1218* (2013.01); *G02F 1/13452* (2013.01); *G02F 1/133305* (2013.01);
(Continued)

(58) Field of Classification Search
CPC ..... G09G 3/2096; G09G 3/3611; H05K 1/189
See application file for complete search history.

(56) References Cited

U.S. PATENT DOCUMENTS 6,262,785 B1    7/2001  Kim
6,657,606 B2   12/2003  Kang et al.
(Continued)

FOREIGN PATENT DOCUMENTS

CN    001381034 A    11/2002
CN    001832179 A     9/2006
(Continued)

OTHER PUBLICATIONS

International Search Report re Application No. PCT/JP2010/056631, dated Jul. 6, 2010.
(Continued)

*Primary Examiner* — Kevin M Nguyen
(74) *Attorney, Agent, or Firm* — Husch Blackwell LLP

(57) ABSTRACT

The display device includes: a flexible display panel including a display portion in which scanning lines and signal lines cross each other; a supporting portion for supporting an end portion of the flexible display panel; a signal line driver circuit for outputting a signal to the signal line, which is provided for the supporting portion; and a scanning line driver circuit for outputting a signal to the scanning line, which is provided for a flexible surface of the display panel in a direction which is perpendicular or substantially perpendicular to the supporting portion.

16 Claims, 16 Drawing Sheets

Related U.S. Application Data continuation of application No. 14/702,118, filed on May 1, 2015, now Pat. No. 9,397,117, which is a continuation of application No. 14/459,818, filed on Aug. 14, 2014, now Pat. No. 9,024,863, which is a continuation of application No. 13/684,946, filed on Nov. 26, 2012, now Pat. No. 8,810,508, which is a continuation of application No. 12/769,298, filed on Apr. 28, 2010, now Pat. No. 8,319,725.

(51) Int. Cl.

| | | |
|---|---|---|
| *G02F 1/1345* | (2006.01) | |
| *G09G 5/00* | (2006.01) | |
| *G09G 3/36* | (2006.01) | |
| *G06F 3/041* | (2006.01) | |
| *G09G 3/20* | (2006.01) | |
| *H05K 1/18* | (2006.01) | |
| *G02F 1/167* | (2019.01) | |
| *G09G 3/3208* | (2016.01) | |
| *G09G 5/39* | (2006.01) | |

(52) U.S. Cl.
CPC ......... *G06F 3/0412* (2013.01); *G09G 3/2096* (2013.01); *G09G 3/3611* (2013.01); *G09G 5/003* (2013.01); *H01L 27/1225* (2013.01); *H05K 1/189* (2013.01); *G02F 1/167* (2013.01); *G06F 2203/04102* (2013.01); *G09G 3/3208* (2013.01); *G09G 3/36* (2013.01); *G09G 5/39* (2013.01); *G09G 2300/0421* (2013.01); *G09G 2300/0478* (2013.01); *H05K 2201/10128* (2013.01)

(56) References Cited

U.S. PATENT DOCUMENTS

| | | | |
|---|---|---|---|
| 6,842,165 B2 | 1/2005 | Inoue | |
| 6,885,146 B2 | 4/2005 | Yamazaki et al. | |
| 6,974,971 B2 | 12/2005 | Young | |
| 7,027,110 B2 | 4/2006 | Akiyama et al. | |
| 7,084,045 B2 | 8/2006 | Takayama et al. | |
| 7,161,650 B2 | 1/2007 | Hirano | |
| 7,199,520 B2 | 4/2007 | Fujii et al. | |
| 7,242,445 B2 | 7/2007 | Akiyama et al. | |
| 7,245,414 B2 | 7/2007 | Liang et al. | |
| 7,339,716 B2 | 3/2008 | Ding et al. | |
| 7,341,924 B2 | 3/2008 | Takayama et al. | |
| 7,378,791 B2 | 5/2008 | Yamazaki et al. | |
| 7,426,008 B2 | 9/2008 | Yamazaki et al. | |
| 7,566,633 B2 | 7/2009 | Koyama et al. | |
| 7,710,528 B2 | 5/2010 | Hasegawa et al. | |
| 7,733,559 B2 | 6/2010 | Kawase et al. | |
| 7,787,097 B2 | 8/2010 | Satoh | |
| 7,829,795 B2 | 11/2010 | Kawase et al. | |
| 7,859,831 B2 | 12/2010 | Nakanishi et al. | |
| 7,906,784 B2 | 3/2011 | Koyama et al. | |
| 7,978,399 B2 | 7/2011 | Yamazaki et al. | |
| 8,035,577 B2 | 10/2011 | Lafarre et al. | |
| 8,115,720 B2 | 2/2012 | Choi | |
| 8,258,406 B2 | 9/2012 | Kawase et al. | |
| 8,599,469 B2 | 12/2013 | Yamazaki et al. | |
| 8,634,050 B2 | 1/2014 | Yamazaki et al. | |
| 9,122,119 B2 | 9/2015 | Yamazaki et al. | |
| 2002/0036616 A1 | 3/2002 | Inoue | |
| 2003/0020701 A1 | 1/2003 | Nakamura et al. | |
| 2003/0162162 A1 | 8/2003 | Marggraff | |
| 2003/0227441 A1* | 12/2003 | Hioki ................... G06F 3/0412 345/156 |
| 2004/0070633 A1 | 4/2004 | Nakamura et al. | |
| 2004/0183958 A1* | 9/2004 | Akiyama .......... G02F 1/133305 349/58 |
| 2004/0263758 A1 | 12/2004 | Lee et al. | |
| 2005/0130391 A1 | 6/2005 | Takayama et al. | |
| 2005/0230818 A1 | 10/2005 | Ohno et al. | |
| 2006/0028419 A1 | 2/2006 | Lee et al. | |
| 2006/0139308 A1 | 6/2006 | Jacobson et al. | |
| 2007/0072439 A1 | 3/2007 | Akimoto et al. | |
| 2007/0077691 A1 | 4/2007 | Watanabe | |
| 2007/0108446 A1 | 5/2007 | Akimoto | |
| 2007/0216670 A1* | 9/2007 | Yatsu ..................... G09G 3/006 345/205 |
| 2008/0019166 A1 | 1/2008 | Jung et al. | |
| 2008/0042940 A1 | 2/2008 | Hasegawa | |
| 2008/0055831 A1 | 3/2008 | Satoh | |
| 2008/0158143 A1 | 7/2008 | Kim | |
| 2008/0158651 A1* | 7/2008 | Kawase ................. G02F 1/167 359/296 |
| 2008/0248609 A1 | 10/2008 | Yamazaki et al. | |
| 2008/0266469 A1 | 10/2008 | Chen et al. | |
| 2009/0021666 A1 | 1/2009 | Chen | |
| 2009/0179840 A1 | 7/2009 | Tanaka et al. | |
| 2009/0185127 A1 | 7/2009 | Tanaka et al. | |
| 2010/0066643 A1 | 3/2010 | King et al. | |
| 2010/0148207 A1 | 6/2010 | Ryutani | |
| 2010/0238612 A1* | 9/2010 | Hsiao ............... G02F 1/133305 361/679.01 |
| 2014/0132908 A1 | 5/2014 | Yamazaki et al. | |
| 2015/0370144 A1 | 12/2015 | Yamazaki et al. | |

FOREIGN PATENT DOCUMENTS

| | | |
|---|---|---|
| CN | 101027753 A | 8/2007 |
| CN | 101097391 A | 1/2008 |
| CN | 101133434 A | 2/2008 |
| CN | 101213500 A | 7/2008 |
| EP | 1 286 326 A1 | 2/2003 |
| EP | 1 589 576 A2 | 10/2005 |
| EP | 1 830 336 A1 | 9/2007 |
| EP | 1 947 505 A1 | 7/2008 |
| EP | 2 051 228 A1 | 4/2009 |
| EP | 2 053 583 A1 | 4/2009 |
| EP | 2 151 862 A1 | 2/2010 |
| JP | 63-006632 A | 1/1988 |
| JP | 03-106769 | 11/1991 |
| JP | 04-355786 A | 12/1992 |
| JP | 05-045633 A | 2/1993 |
| JP | 11-272205 A | 10/1999 |
| JP | 2001-255513 A | 9/2001 |
| JP | 2001-312227 A | 11/2001 |
| JP | 2002-015858 A | 1/2002 |
| JP | 2002-026467 A | 1/2002 |
| JP | 2003-058081 A | 2/2003 |
| JP | 2003-058544 A | 2/2003 |
| JP | 2003-086352 A | 3/2003 |
| JP | 2003-222898 A | 8/2003 |
| JP | 2003-280548 A | 10/2003 |
| JP | 2003-330384 A | 11/2003 |
| JP | 2003-337322 A | 11/2003 |
| JP | 2003-337353 A | 11/2003 |
| JP | 2003-337541 A | 11/2003 |
| JP | 2004-087939 A | 3/2004 |
| JP | 2004-519866 | 7/2004 |
| JP | 2004-279867 A | 10/2004 |
| JP | 2005-084228 A | 3/2005 |
| JP | 2005-197673 A | 7/2005 |
| JP | 2005-251845 A | 9/2005 |
| JP | 2005-338179 A | 12/2005 |
| JP | 2006-058764 A | 3/2006 |
| JP | 2006-145934 A | 6/2006 |
| JP | 2006-270077 A | 10/2006 |
| JP | 2006-287982 A | 10/2006 |
| JP | 2007-158304 A | 6/2007 |
| JP | 2007-219503 A | 8/2007 |
| JP | 2008-046565 A | 2/2008 |
| JP | 2008-269584 A | 11/2008 |
| JP | 2008-299269 A | 12/2008 |
| JP | 2008-310312 A | 12/2008 |
| JP | 2009-063836 A | 3/2009 |
| KR | 2006-0056692 A | 5/2006 |
| KR | 2008-0061039 A | 7/2008 |
| TW | 200404188 | 3/2004 |
| TW | 200510845 | 3/2005 |

(56) References Cited

FOREIGN PATENT DOCUMENTS

| | | |
|---|---|---|
| TW | 200535754 | 11/2005 |
| TW | 200613869 | 5/2006 |
| TW | 200710775 | 3/2007 |
| TW | M310415 U | 4/2007 |
| TW | I286629 B | 9/2007 |
| TW | 200802060 | 1/2008 |
| TW | 200802265 | 1/2008 |
| TW | 200839359 | 10/2008 |
| TW | 200842439 | 11/2008 |
| TW | 200844545 | 11/2008 |
| TW | 200903088 | 1/2009 |
| TW | 200913177 | 3/2009 |
| TW | 200919013 | 5/2009 |
| WO | WO 2002/056284 A1 | 7/2002 |
| WO | WO 2002/082555 A2 | 10/2002 |
| WO | WO 2004/025356 A2 | 3/2004 |
| WO | WO 2005/106934 A1 | 11/2005 |
| WO | WO 2006/085271 A2 | 8/2006 |
| WO | WO 2006/090434 A1 | 8/2006 |
| WO | WO 2007/004131 A2 | 1/2007 |
| WO | WO 2008/013013 A1 | 1/2008 |
| WO | WO 2008/013014 A1 | 1/2008 |

OTHER PUBLICATIONS

Written Opinion re Application No. PCT/JP2010/056631, dated Jul. 6, 2010.
Chinese Office Action re Application No. CN 201080019425.7, dated Sep. 10, 2013.
Taiwanese Office Action re Application No. TW 99113333, dated Nov. 10, 2014.
Taiwanese Office Action re Application No. TW 102126450, dated Dec. 22, 2014.
Taiwanese Office Action re Application No. TW 103123459, dated Jul. 9, 2015.
Chinese Office Action re Application No. CN 201310314979.5, dated Feb. 3, 2016.
Chinese Office Action re Application No. CN 201410343144.7, dated May 27, 2016.
Taiwanese Office Action re Application No. TW 104139451, dated Jul. 20, 2016.
Chinese Office Action re Application No. CN 201510085232.6, dated Jan. 26, 2017.
Taiwanese Office Action re Application No. TW 105134059, dated Jun. 16, 2017.

* cited by examiner

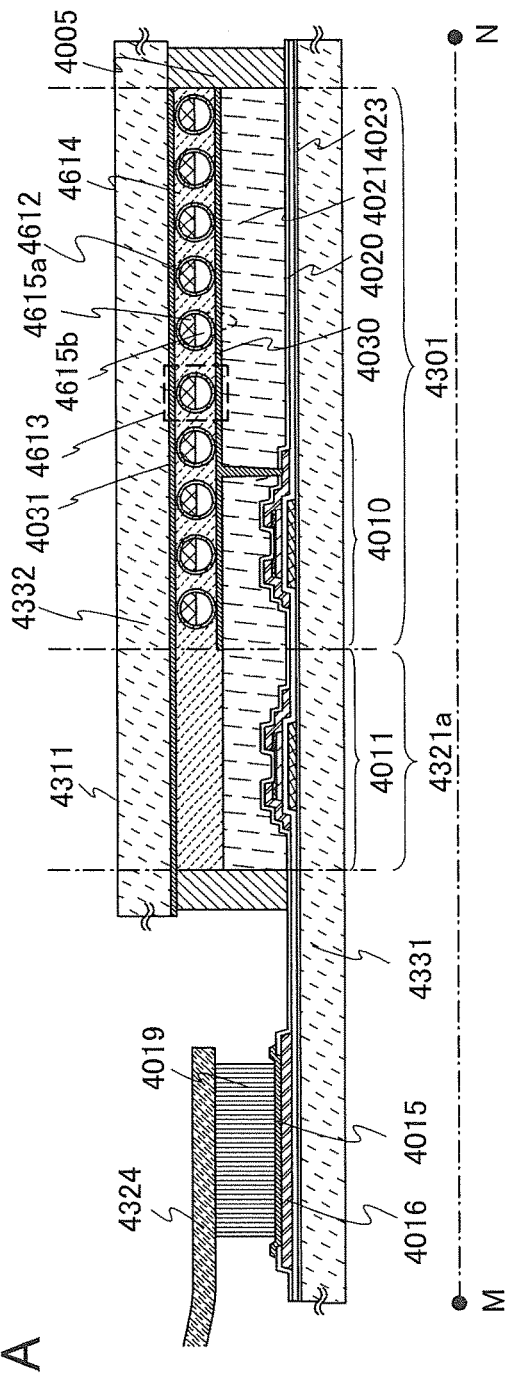
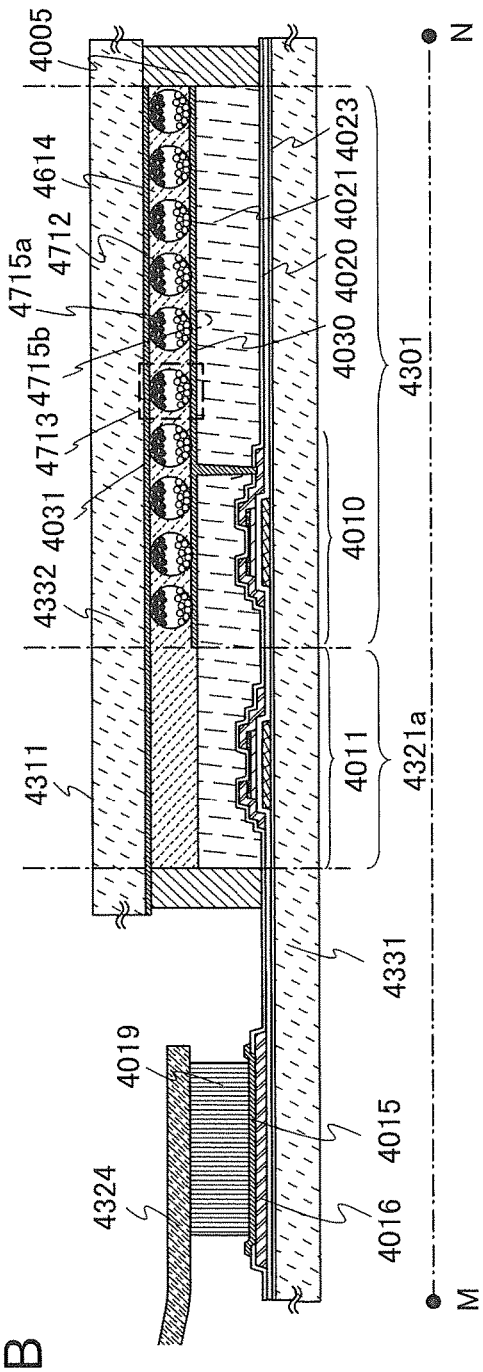
FIG. 12A
FIG. 12B

DISPLAY DEVICE

This application is a continuation of copending application Ser. No. 15/210,097 filed on Jul. 14, 2016 which is a continuation of application Ser. No. 14/702,118 filed on May 1, 2015 (now U.S. Pat. No. 9,397,117 issued Jul. 19, 2016) which is a continuation of application Ser. No. 14/459,818 filed on Aug. 14, 2014 (now U.S. Pat. No. 9,024,863 issued May 5, 2015) which is a continuation of application Ser. No. 13/684,946 filed on Nov. 26, 2012 (now U.S. Pat. No. 8,810,508 issued Aug. 19, 2014) which is a continuation of application Ser. No. 12/769,298 filed on Apr. 28, 2010 (now U.S. Pat. No. 8,319,725 issued Nov. 27, 2012), which are all incorporated herein by reference.

TECHNICAL FIELD

The present invention relates to a display device.

BACKGROUND ART

In recent years, the mode of providing text data or image data of newspapers, magazines, and the like as electronic data has been increasingly adopted with the development of technique for digitalization. This kind of electronic data is featured in that the contents thereof are viewed with a display device equipped with a personal computer (PC) and the like.

However, the display device equipped with a personal computer (PC) and the like significantly differs from the paper media such as newspapers and magazines in that the convenience such as portability is poor.

On the other hand, aiming to solve the above-described difference from the paper media, flexible electronic paper has been proposed (for example, see Patent Document 1). In the case where a display portion of the flexible electronic paper is formed using an element such as a transistor, a circuit for driving the transistor needs be provided. In that case, bending of the electronic paper might cause breaking of the circuit. Further, the degree of bending of the electronic paper might be limited by the driver circuit.

PATENT DOCUMENT

Patent Document 1: Japanese Published Patent Application No. 2003-337353

DISCLOSURE OF INVENTION

An object of one embodiment of the present invention is to provide a display device in which occurrence of breaking of a driver circuit at the time when a flexible panel is handled is suppressed. An object of one embodiment of the present invention is to provide a display device in which the structure is simplified.

One embodiment of the present invention is a display device including: a flexible display panel including a display portion in which scanning lines and signal lines cross each other; a supporting portion for supporting an end portion of the flexible display panel; a signal line driver circuit for outputting a signal to the signal line, which is provided for the supporting portion; and a scanning line driver circuit for outputting a signal to the scanning line, which is provided for a flexible surface of the display panel in a direction which is perpendicular or substantially perpendicular to the supporting portion.

According to one embodiment of the present invention, a display device in which a scanning line driver circuit includes a plurality of circuit portions and the plurality of circuit portions are spaced from each other may be provided.

According to one embodiment of the present invention, a display device in which a stress concentration region is provided between a plurality of circuit portions may be provided.

According to one embodiment of the present invention, a display device in which a scanning line driver circuit and a signal line driver circuit each includes a transistor and the transistor included in the scanning line driver circuit and the transistor included in the signal line driver circuit have structures which are different from each other may be provided.

According to one embodiment of the present invention, a display device in which a channel layer of a transistor included in a scanning line driver circuit is a non-single-crystal semiconductor and a channel layer of a transistor included in a signal line driver circuit is a single crystal semiconductor may be provided.

According to one embodiment of the present invention, a display device in which a non-single-crystal semiconductor is amorphous silicon, microcrystalline silicon, polysilicon, or an oxide semiconductor may be provided.

According to one embodiment of the present invention, a display device in which a display portion includes a transistor and a channel layer included in a transistor included in the display portion and a channel layer included in a transistor included in a scanning line driver circuit are formed using the same material may be provided.

According to one embodiment of the present invention, a display device in which a supporting portion is provided with at least one of a battery, an antenna, a CPU, and a memory in addition to a signal line driver circuit may be provided.

In this specification and the like, a "semiconductor device" indicates any device capable of functioning by utilizing semiconductor characteristics, and electro-optic devices, semiconductor circuits, and electronic appliances are all included in the category of the semiconductor device.

Further, in this specification and the like, a "display device" includes in its category a light-emitting device and a liquid crystal display device. The light-emitting device includes a light-emitting element and the liquid crystal display device includes a liquid crystal element. The light-emitting element includes in its category any element whose luminance is controlled by a current or a voltage; specifically, an inorganic electroluminescent (EL) element, an organic EL element, and the like can be given as examples thereof.

In accordance with one embodiment of the present invention, a sturdy display device with less breaking of a driver circuit can be provided.

In accordance with one embodiment of the present invention, cost of a display device can be reduced by simplifying the structure thereof.

BRIEF DESCRIPTION OF THE DRAWINGS

FIGS. 12A and 12B each illustrate one mode of a display panel of the present invention.

BEST MODE FOR CARRYING OUT THE INVENTION

Figure 1A:
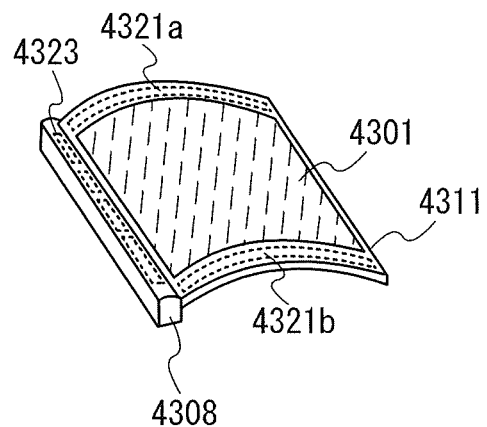
FIGS. 1A and 1B illustrate one mode of a display device of the present invention.

Hereinafter, Embodiments are described in detail using drawings. Note that the present invention is not limited to the description of the embodiments, and it is apparent to those skilled in the art that modes and details can be modified in various ways without departing from the spirit of the present invention disclosed in this specification and the like. Structures of different embodiments can be implemented by combination appropriately. In description of the present invention hereinafter, the same reference numerals are used for indicating the same or similar function portions throughout the drawings, description on which is not repeated.

Note that the size, the thickness of a layer, and a region of each structure illustrated in the drawings and the like in the embodiments are exaggerated for simplicity in some cases. Therefore, the embodiments of the present invention are not limited by those scales.

Note that the numeral terms such as "first", "second", and "third" in this specification are used in order to avoid confusion between components and do not set a limitation on number.

Embodiment 1

In Embodiment 1, an example of a display device will be described with reference to drawings.

The display device described in Embodiment 1 includes the following: a flexible display panel including a display portion in which scanning lines and signal lines cross each other; a supporting portion for supporting an end portion of the flexible display panel; a signal line driver circuit for outputting a signal to the signal line, which is provided for the supporting portion; and a scanning line driver circuit for outputting a signal to the scanning line, which is provided for a flexible surface of the display panel in a direction which is perpendicular or substantially perpendicular to the supporting portion.

Figure 1B:
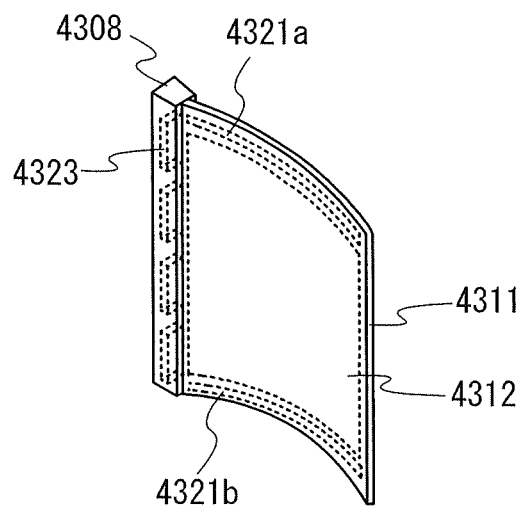

FIG. 1 illustrates the case where a supporting portion 4308 is provided at an end portion of a display panel 4311. A specific structure of the display device will be described using FIGS. 1A and 1B below. FIG. 1A illustrates the display device which is horizontally disposed, and FIG. 1B illustrates the display device which is vertically disposed.

The display device illustrated in FIGS. 1A and 1B includes the display panel 4311 including a display portion 4301, the supporting portion 4308 provided at an end portion of the display panel 4311, scanning line driver circuits 4321a and 4321b for controlling display on the display portion 4301, and a signal line driver circuit 4323 for controlling display on the display portion 4301.

The scanning line driver circuits 4321a and 4321b are provided for the display panel 4311 and the signal line driver circuit 4323 is provided inside the supporting portion 4308.

The display panel 4311 may be flexible. In that case, a pixel circuit included in the display portion 4301 and the scanning line driver circuits 4321a and 4321b may be provided over a flexible substrate such as a plastic substrate.

It is preferable that the supporting portion 4308 be less flexible (more rigid) than at least the display panel 4311. For example, a housing forming the supporting portion 4308 can be formed using plastic, metal, or the like which is thicker than the display panel 4311. In that case, the display device can be bent (warped) at a portion other than the supporting portion 4308.

There is no particular limitation on where to arrange the supporting portion 4308. For example, the supporting portion 4308 can be provided along an end portion of the display panel 4311. For example, as shown in FIGS. 1A and 1B, in the case where the display panel 4311 has a rectangular shape, the supporting portion 4308 can be provided along a predetermined side of the display panel 4311 (so that the side is fixed). Note that the "rectangular shape" here includes a shape in which a corner of the rectangular is rounded.

The signal line driver circuit 4323 is provided inside the supporting portion 4308. For example, the supporting portion 4308 is formed using a columnar housing with a hollow or a cylindrical housing with a hollow, and the signal line driver circuit 4323 can be provided in the hollow. When the signal line driver circuit 4323 is provided inside the supporting portion 4308, damage to the signal line driver circuit 4323 due to bending of the display panel 4311 can be prevented.

Further, as shown in FIGS. 1A and 1B, the scanning line driver circuits 4321a and 4321b are preferably provided at both end portions of the display panel 4311 in a direction parallel or substantially parallel to the supporting portion 4308. As a result, leading of a wiring can be reduced and the structure can be simplified in comparison with the case where the scanning line driver circuit and the signal line driver circuit are provided at one portion (e.g., the supporting portion 4308).

Further, the scanning line driver circuits 4321a and 4321b and the pixel circuit included in the display portion 4301 may be formed over a flexible substrate through the same process, so that the scanning line driver circuits 4321a and 4321b can be bent and cost reduction can be achieved.

The pixel circuit included in the display portion 4301 and the scanning line driver circuits 4321a and 4321b each can be formed using a thin film transistor or the like. On the other hand, a high-speed operation circuit such as the signal line driver circuit 4323 can be formed using an integrated circuit (IC) formed using a semiconductor substrate such as a silicon substrate or an SOI substrate, and the IC can be provided inside the supporting portion 4308.

When the IC including the high-speed operation circuit such as a signal line driver circuit is provided inside the supporting portion and the scanning line driver circuit and the pixel circuit included in the display portion are formed using elements such as thin film transistors over a flexible substrate as described above, the display panel can be bent easily, occurrence of breaking of the IC due to the bending of the display panel can be suppressed, and cost reduction can be achieved in comparison with the case where the signal line driver circuit and the scanning line driver circuit are provided using an IC. In addition, when the scanning line driver circuit is provided on the display panel at the end portion of the display panel in a direction perpendicular or substantially perpendicular to the supporting portion, leading of a wiring can be suppressed and the structure can be simplified.

Although the case where the scanning line driver circuit is provided at both end portions of the display panel 4311 is illustrated in FIGS. 1A and 1B, the scanning line driver circuit (either one of the scanning line driver circuit 4321a and the scanning line driver circuit 4321b) may be provided at one end portion.

Embodiment 1 can be implemented in appropriate combination with any structure described in the other embodiments.

Embodiment Mode 2

In Embodiment 2, a specific structure of the above-described display device illustrated in FIGS. 1A and 1B will be described using drawings. The structures described in Embodiment 2 are in common with that described in Embodiment 1 in many points, and thus, in the description below, description of the common points will be omitted and different points will be described in detail.

Figure 2A:
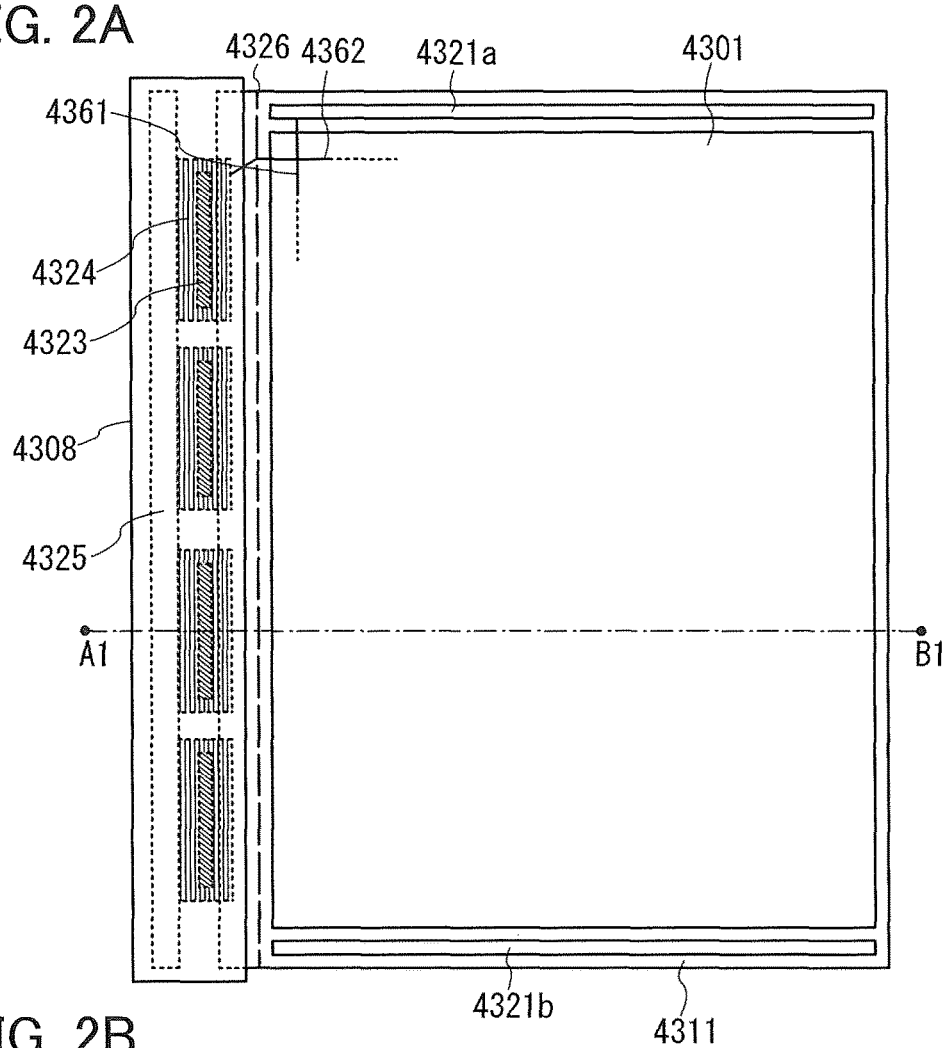
FIGS. 2A to 2C illustrate one mode of a display device of the present invention.
Figure 2B:
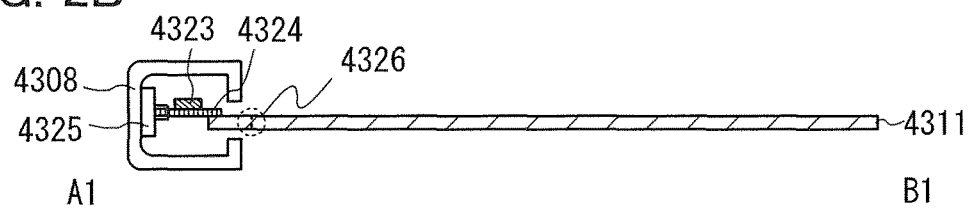
Figure 2C:
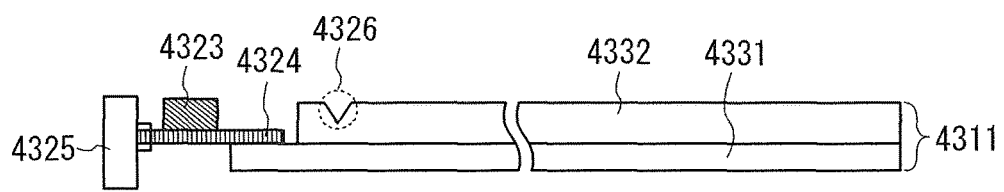

First, an example of the specific structure of the display device is described using FIGS. 2A to 2C. FIG. 2A is a plane view of the display device, FIG. 2B is a cross-sectional view along line A1-B1 of FIG. 2A, and FIG. 2C is a detailed schematic view of the cross section.

As for the display device shown in FIGS. 2A to 2C, the supporting portion 4308 is formed using a housing with a hollow, and the signal line driver circuit 4323 is provided inside the housing. In this embodiment, the signal line driver circuit 4323 is formed using an IC, and the IC is provided inside the supporting portion 4308. The IC can be formed using an SOI substrate, a semiconductor substrate such as a silicon substrate, or the like. Any circuit (e.g., a CPU, a memory) other than the signal line driver circuit can be provided for the IC as well.

Further, FIGS. 2A to 2C illustrate the case where the IC provided inside the supporting portion 4308 is mounted on a flexible printed circuit (FPC) by a tape automated bonding (TAB) method. More specifically, the signal line driver circuit 4323 for controlling the display portion 4301 is provided on an FPC 4324, and the FPC 4324 is electrically connected to a printed board 4325.

As shown in FIGS. 2A to 2C, the printed board 4325 can be provided to be in contact with the supporting portion 4308.

In the case where the signal line driver circuit 4323 is provided on the FPC 4324, it is preferable to provide a stress concentration region 4326 for the display panel 4311. The stress concentration region 4326 provided for the display panel makes it possible to reduce the stress which is applied to the FPC 4324 at the time when the display panel 4311 is bent and to suppress the occurrence of breaking of the signal line driver circuit 4323 provided on the FPC 4324.

The stress concentration region means a region where a stress formed by deformation of a material due to cutting or the like, change of the strength against bending and/or extension due to attachment of a material or the like, or the like is concentrated. Specifically, the stress concentration region 4326 can be formed by providing a cut portion (depression or groove) at a portion at which the display panel 4311 is bent.

For example, the display panel 4311 can be formed using an element substrate 4331 and a sealing substrate 4332, and one or both of the element substrate 4331 and the sealing substrate 4332 can be provided with a cut portion. FIGS. 2A to 2C illustrate the case where the cut portion is provided in the sealing substrate 4332 to form the stress concentration region 4326. In addition, in the structure described here, the scanning line driver circuits 4321a and 4321b and a pixel circuit which drives the display portion 4301 can be formed on the element substrate 4331, and these circuits can be electrically connected to the FPC 4324.

In the display portion 4301, pixels are arranged (disposed) in matrix, and scanning lines 4361 and signal lines 4362 are arranged so as to dissect at right angles. As for the arrangement of the pixels, the pixels may be arranged either linearly in a longitudinal direction and in a lateral direction or zigzag. Therefore, in the case of stripe arrangement or the case where dots for three colors are arranged in delta, the scanning lines 4361 and the signal lines 4362 are arranged depending on the pixel arrangement.

The stress concentration region 4326 may be provided along a direction in which the display panel 4311 is bent. For example, in FIG. 2A, the cut portion may be provided from an upper end to a bottom end of the display panel 4311 along a direction which is parallel to or substantially parallel to the supporting portion 4308, so that the direction in which the display panel 4311 is bent can be controlled (the display panel 4311 can be bent in a direction perpendicular to or substantially perpendicular to the supporting portion 4308 as selected) and the occurrence of breaking of the signal line driver circuit 4323 provided on the FPC 4324 can be suppressed.

The stress concentration region 4326 can be provided inside or outside the supporting portion 4308. For example, the stress concentration region 4326 is preferably provided outside the supporting portion 4308 (e.g., between the supporting portion 4308 and the display portion 4301) in the case where the supporting portion 4308 is provided so as to be close to the display panel 4311.

Figure 3A:
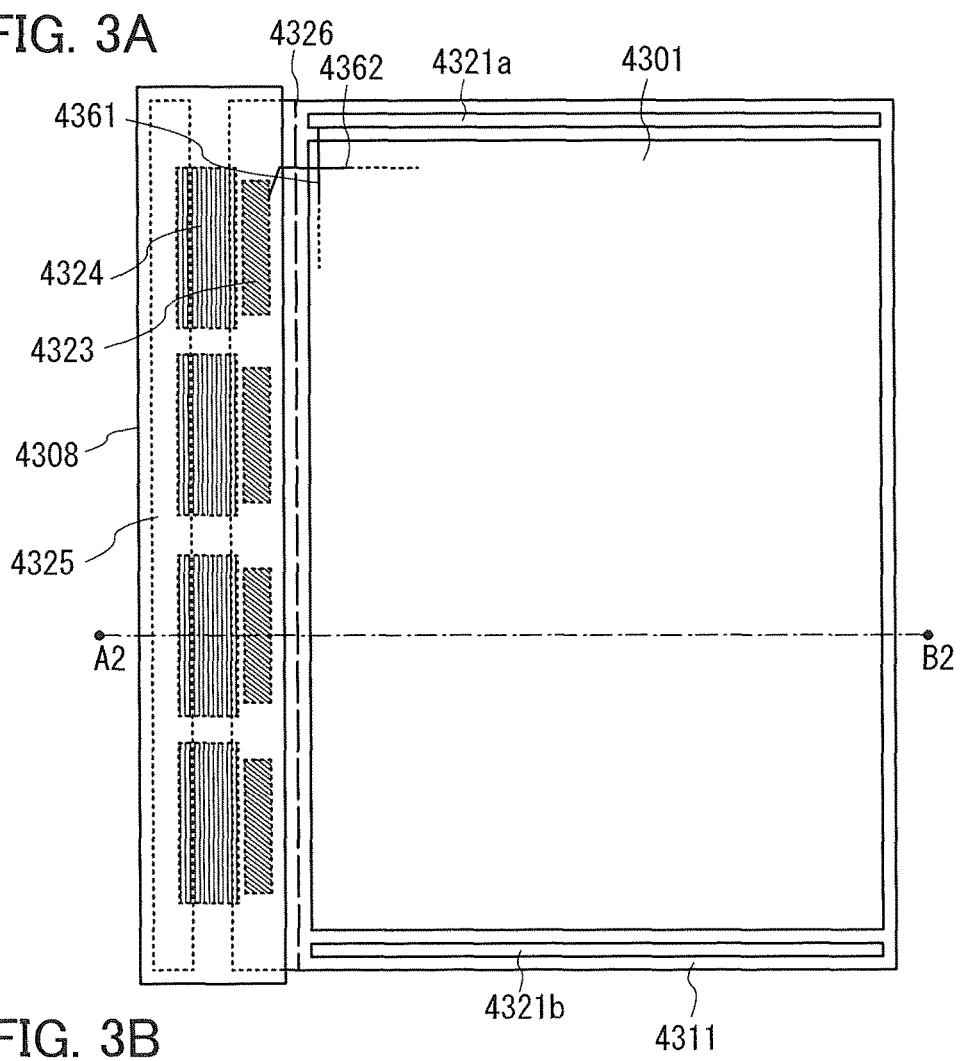
FIGS. 3A to 3C illustrate one mode of a display device of the present invention.
Figure 3B:
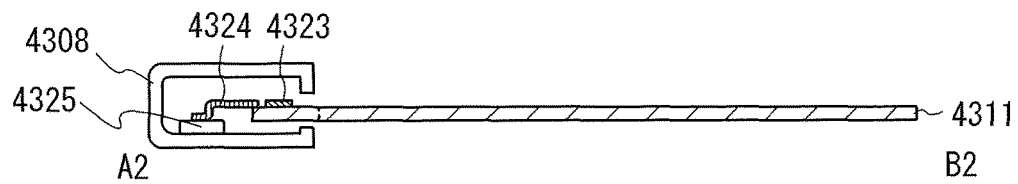
Figure 3C:
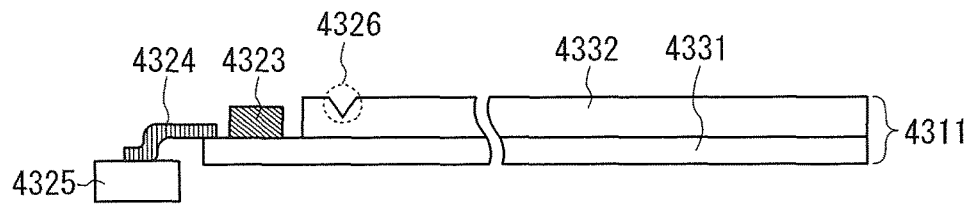

Next, a structure of the display device, which is different from that in FIGS. 2A to 2C is described using FIGS. 3A to 3C. FIG. 3A is a plane view of the display device, FIG. 3B is a cross-sectional view along line A2-B2 of FIG. 3A, and FIG. 3C is a detailed schematic view of the cross section.

FIGS. 3A to 3C illustrate the case where an IC where the signal line driver circuit 4323 is formed is mounted on the display panel 4311 by a chip on glass (COG) method. More specifically, the signal line driver circuit 4323 for controlling the display portion 4301 is provided on the element substrate 4331 included in the display panel 4311, and the signal line driver circuit 4323 is electrically connected to the printed board 4325 through the FPC 4324.

As shown in FIGS. 3A to 3C, in the case where the signal line driver circuit is provided on the display panel, similarly to the case of FIGS. 2A to 2C, the stress concentration region 4326 is preferably provided for the display panel 4311. In this case, the stress concentration region 4326 is provided in a region which is different from (is provided so as to avoid) the region in which the signal line driver circuit 4323 is provided. For example, when the stress concentration region 4326 is provided on the sealing substrate 4332 side, the stress which is applied to the signal line driver circuit 4323 at the time when the display panel 4311 is bent can be reduced and the occurrence of breaking of the signal line driver circuit 4323 can be suppressed.

Figure 4A:
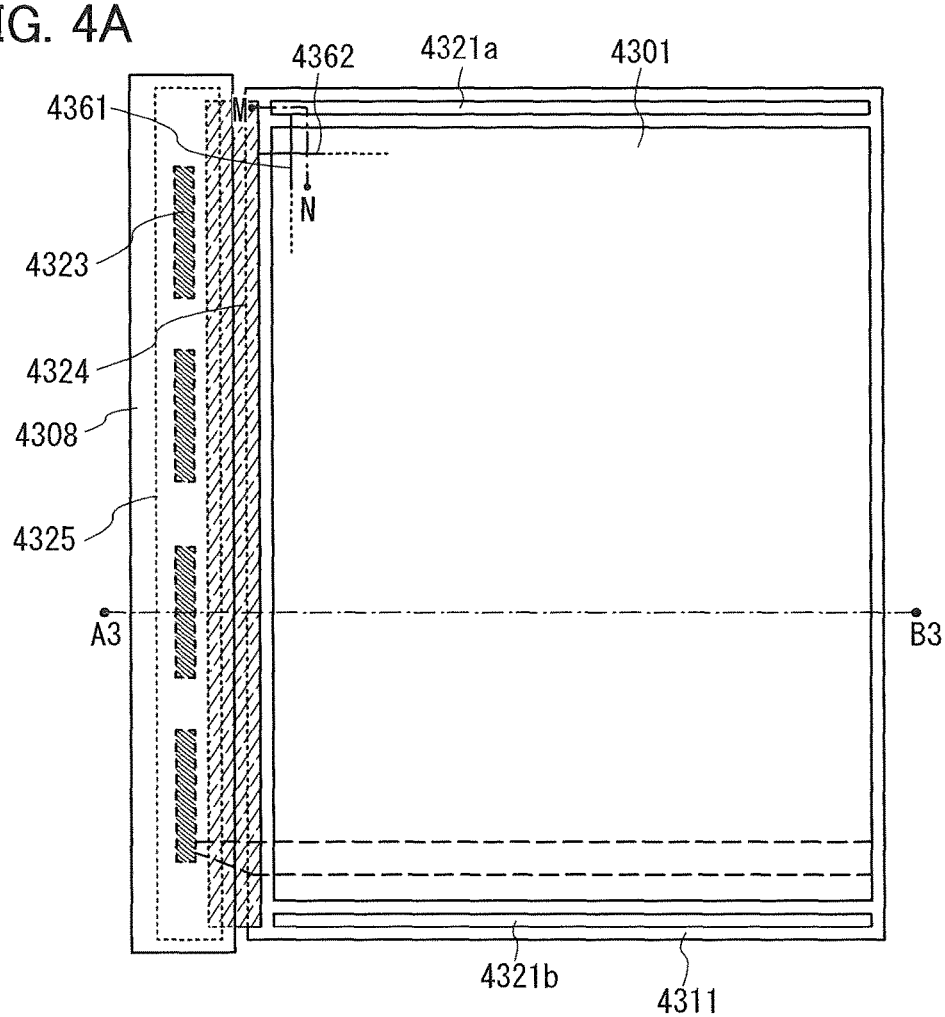
FIGS. 4A to 4C illustrate one mode of a display device of the present invention.
Figure 4B:
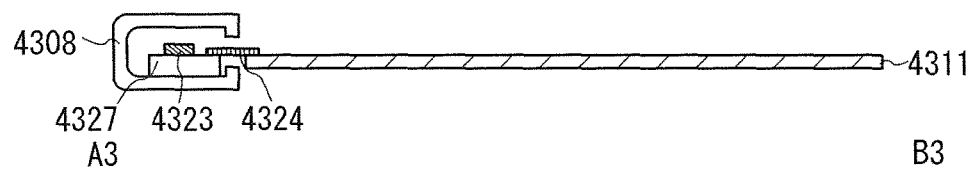
Figure 4C:
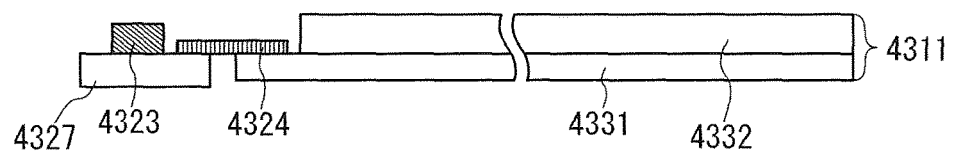

Next, a structure of the display device, which is different from those in FIGS. 2A to 2C and FIGS. 3A to 3C is described using FIGS. 4A to 4C. FIG. 4A is a plane view of the display device, FIG. 4B is a cross-sectional view along line A3-B3 of FIG. 4A, and FIG. 4C is a detailed schematic view of the cross section.

FIGS. 4A to 4C illustrate the case where an IC in which a circuit such as a signal line driver circuit is formed is provided on a printed board, and the printed board and a display panel are connected with an FPC. More specifically, the signal line driver circuit 4323 for controlling the display portion 4301 is provided on the printed board 4327, and the display panel 4311 and the signal line driver circuit 4323 are electrically connected to each other through the FPC 4324.

In FIGS. 4A to 4C, the display panel 4311 can be bent with the FPC 4324, and therefore a stress concentration region is not necessarily provided for the display panel 4311.

Figure 5:
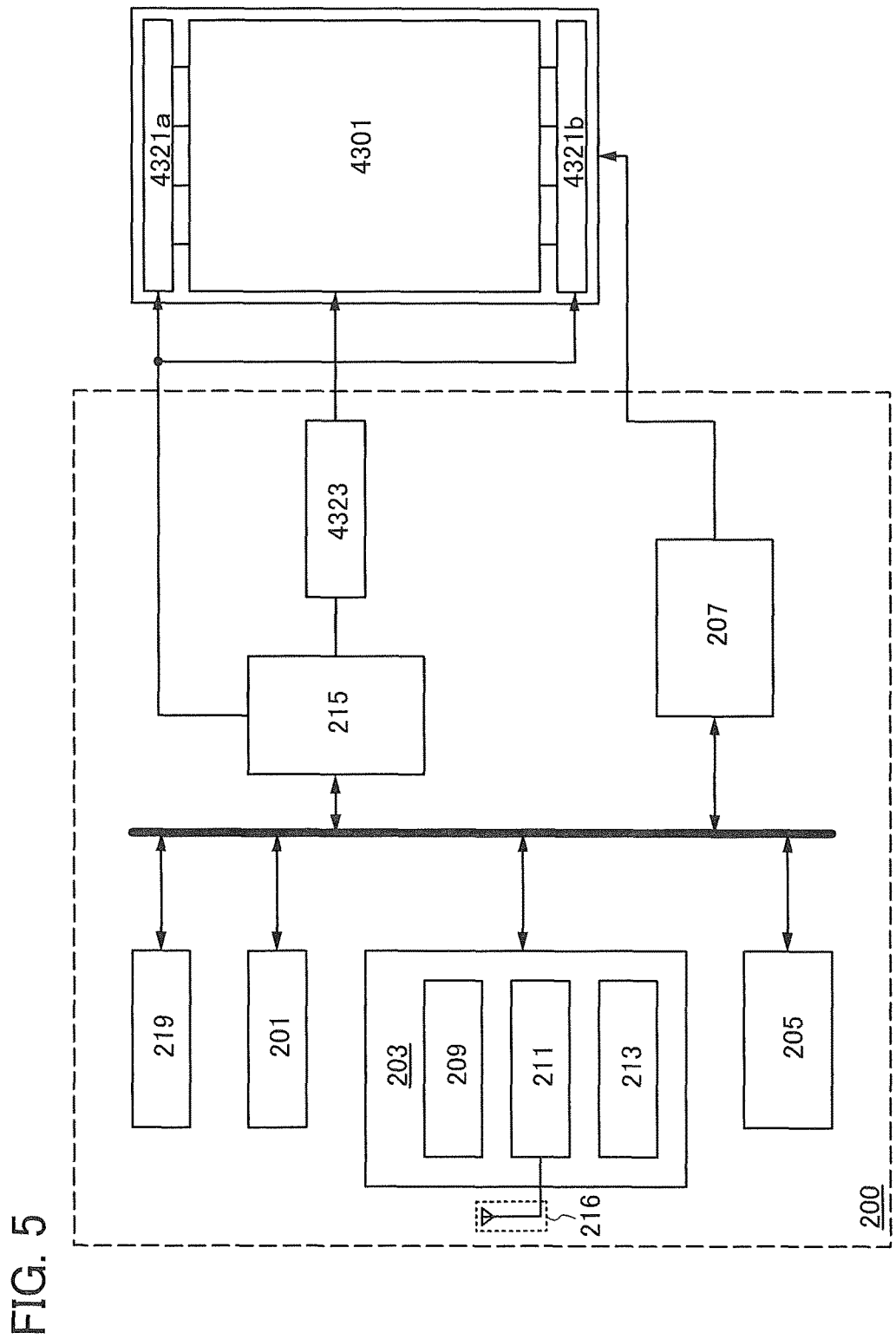
FIG. 5 illustrates one mode of a supporting portion of a display device of the present invention.

Next, examples of the supporting portion 4308 and a configuration of a circuit which can be provided for the supporting portion 4308 are described using FIG. 5.

FIG. 5 illustrates the case where a display control portion 200 including a signal line driver circuit is incorporated in the supporting portion 4308. Such a circuit can be formed using an IC formed using an SOI substrate, a semiconductor substrate such as a silicon substrate, or the like.

The display control portion 200 can include a CPU 201, a memory portion 203, a power feeding portion 205, a power supply circuit 207, an image signal generation circuit 215, the signal line driver circuit 4323, an operation portion 219, and the like. Those components can be connected to each other through an interface or the like. The display control portion 200 is electrically connected to the display panel 4311. Although the operation portion 219 is provided in the supporting portion 4308 in this case, the operation portion 219 can be provided on the display panel 4311.

The CPU 201 controls the operation of the whole display device.

Data to be displayed on the display portion 4301 is input to a data input portion 211 from an external device. Note that the data input portion 211 may include an antenna 216 for transmitting/receiving data to/from an external device. In that case, the data input portion 211 has a function of transferring data received by the antenna 216 or data stored in a memory medium (an external memory 213) to an internal memory 209.

The memory portion 203 can include the internal memory 209, the data input portion 211, and the external memory 213. Data to be displayed on the display portion 4301, a program for operating the display device, or the like can be recorded in the internal memory 209, the data input portion 211, and the external memory 213.

The internal memory 209 includes a memory portion for storing a program for processing a signal output to the image signal generation circuit 215 and/or the power supply circuit 207 on the basis of a signal from the power feeding portion 205, the operation portion 219, or the like, data transferred from the data input portion 211, or the like. As examples of the internal memory 209, a DRAM (dynamic random access memory), an SRAM (static random access memory), a mask ROM (read only memory), a PROM (programmable read only memory), and the like are given.

As an example of the external memory 213, a memory medium such as an IC card or a memory card is given.

The power feeding portion 205 includes a secondary battery, a capacitor, and the like. A reduction in size of the power feeding portion 205 is possible when, for example, a lithium battery, preferably, a lithium polymer battery utilizing a gel electrolyte, a lithium ion battery, or the like is used as the secondary battery. Needless to say, any battery can be used as long as it can be charged, and a battery that can be charged and discharged, such as a nickel-metal hydride battery, a nickel-cadmium battery, an organic radical battery, a lead storage battery, an air secondary battery, a nickel-zinc battery, or a silver-zinc battery may be used. As the capacitor, an electric double layer capacitor, a lithium ion capacitor, another capacitor with high capacitance, or the like can be used. The capacitor is preferably used because it is less likely to be deteriorated even if the number of charging and discharging is increased and is excellent in rapid charging. The shape of the power feeding portion 205 may be sheet-like, cylinder-like, prism-like, plate-like, coin-like, or the like, which can be selected as appropriate.

Further, the power feeding portion 205 can have a structure in which electric power is wirelessly supplied. In that case, an antenna may be provided for the power feeding portion 205.

The power supply circuit 207 is a circuit for controlling power supply to a display element in accordance with the control by the CPU 201, in order to perform display/non-display on the display panel 4311.

The operation portion 219 can be provided with a keyboard, an operation button, or the like. In the case where the operation portion 219 is provided for the display panel 4311, the display portion 4301 can function as a touch display, so that the display portion can function as an operation portion.

The structure in which the display control portion 200 is incorporated in the supporting portion 4308 is illustrated in FIG. 5, and a so-called power device such as a switching power source or a DC-DC converter may further be provided.

Further, in the display device illustrated in FIG. 5, by operation of the operation portion 219, power input and switching of display can be performed. The display device may have a structure in which the display portion 4301 functions as a touch display so as to be operated by touching with a finger or an input pen.

As described above, by incorporating the display control portion 200 in the supporting portion 4308, the display control portion 200 can be protected by a housing. Further, the thickness of the display device can be reduced.

In Embodiments 1 and 2, the scanning line driver circuits 4321a and 4321b are provided along the display portion 4301 on the display panel 4311; and the present invention is not limited thereto.

Figure 6A:
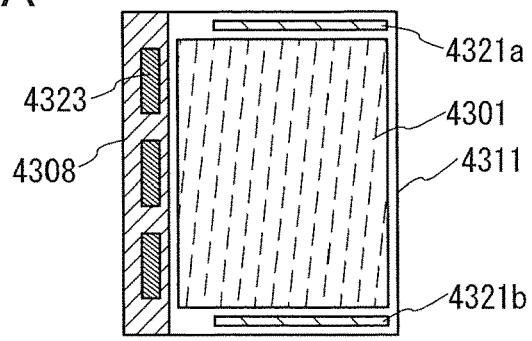
FIGS. 6A to 6D each illustrate one mode of a display device of the present invention.

For example, as illustrated in FIG. 6A, in the display panel 4311, the scanning line driver circuits 4321a and 4321b can be provided so that the distance between the scanning line driver circuits 4321a and 4321b and the supporting portion 4308 is larger than that between the display portion 4301 and the supporting portion 4308. In general, the density of elements included in each of the scanning line driver circuits 4321a and 4321b is higher than that in the pixel circuit; therefore, the provision of the scanning line driver circuits 4321a and 4321b away from the portion at which the display panel 4311 is bent makes it possible to suppress the occurrence of breaking of the scanning line driver circuits 4321a and 4321b.

Figure 6B:
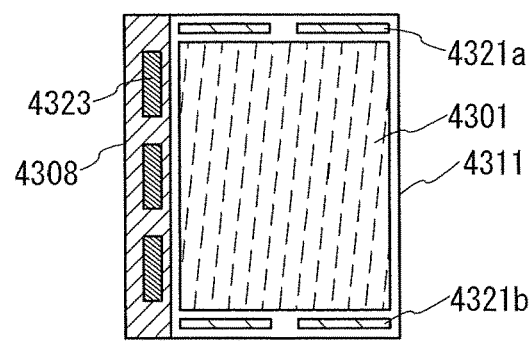
Figure 6C:
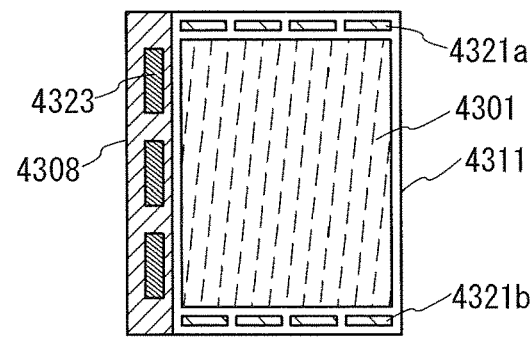

As illustrated in FIGS. 6B and 6C, each of the scanning line driver circuits 4321a and 4321b may be divided into a plurality of circuit portions of scanning line driver circuits, and the plurality of circuit portions of scanning line driver circuits may be provided so as to be spaced from each other; accordingly, even in the case where the display panel 4311 is bent, stress applied to the scanning line driver circuits 4321a and 4321b can be reduced and the occurrence of breaking of the scanning line driver circuits 4321a and 4321b can be suppressed. In FIG. 6B, each of the scanning line driver circuits 4321a and 4321b is divided into two circuit portions of scanning line driver circuits. In FIG. 6C, each of the scanning line driver circuits 4321a and 4321b is divided into four circuit portions of scanning line driver circuits. The number of division of each scanning line driver circuit is not limited thereto.

Figure 6D:
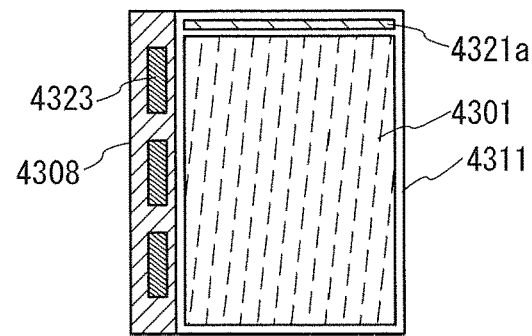

As illustrated in FIG. 6D, the scanning line driver circuit (either one of the scanning line driver circuit 4321a and the scanning line driver circuit 4321b) may be provided at one end portion of the display panel 4311. This makes it possible to reduce the frame size of the display device.

Embodiment 2 can be implemented in appropriate combination with any structure described in the other embodiments.

Embodiment 3

In this embodiment, examples of the function effect of the above embodiments in the case where a display device including a flexible display panel is bent to be used will be described using FIGS. 7A and 7B, 8A to 8C, 9A to 9C, and 10A to 10C.

Figure 7A:
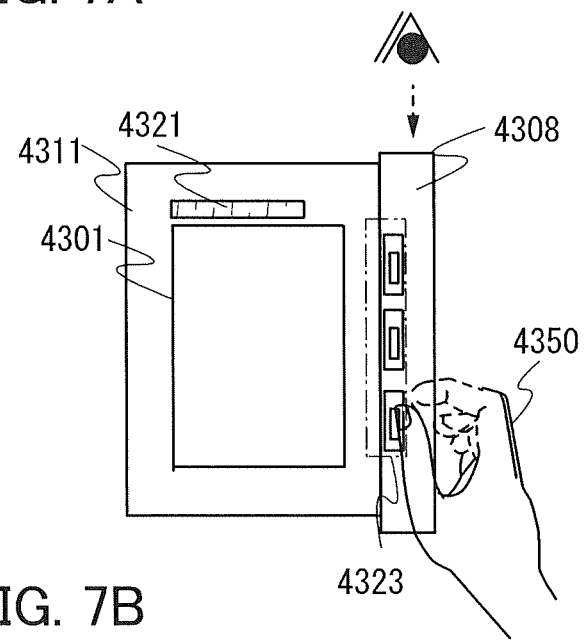
FIGS. 7A and 7B illustrate one mode of a display device of the present invention.
Figure 7B:
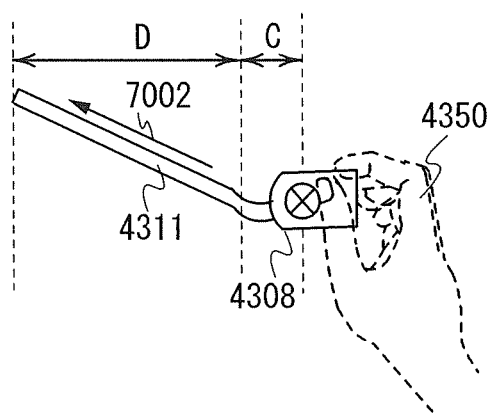

First, description is made on a front plane view and a top plane view of the case where a user uses the display device, illustrated in FIG. 7A and FIG. 7B respectively.

The display device illustrated in FIG. 7A includes the display panel 4311 and the supporting portion 4308. The display panel 4311 includes a display portion 4301, and display on the display portion 4301 is controlled by the scanning line driver circuit 4321 for supplying a scanning signal to the display portion 4301 and the signal line driver circuit 4323 for supplying an image signal to the display portion 4301. In FIG. 7A, a user's hand 4350 gripping the supporting portion 4308 is also illustrated. Further, in the front plane view of FIG. 7A, a line of sight when the top plane view of FIG. 7B is seen is also illustrated.

In the top plane view shown in FIG. 7B, the display panel 4311 and the supporting portion 4308 are illustrated. As shown in FIG. 7B, when a user uses the display device with his/her hand 4350, a bending portion (hereinafter referred to as a bending portion C) is formed in a range indicated by an arrow C and a non-bending portion (hereinafter referred to as a non-bending portion D) is formed in a range indicated by an arrow D in the flexible display panel.

Note that in FIG. 7B, as an example, description is made on the case where the bending portion C of the display panel 4311 is positioned on the side which is near the supporting portion 4308 and the non-bending portion D is positioned on the side which is far from the supporting portion 4308. The state of bending is different between the bending portion C and the non-bending portion D depending on the structure of the supporting portion 4308 and a material of a substrate of the display panel. Therefore, the bending portion C may be positioned on the side which is far from the supporting portion 4308 and the non-bending portion D may be positioned on the side which is near the supporting portion 4308.

The display device has a structure in which the display panel 4311 is supported by the supporting portion 4308; therefore, the bending portion C and the non-bending portion D are formed in the display panel 4311 in a direction (indicated by an arrow 7002 in FIG. 7B) which is perpendicular or substantially perpendicular to a direction in which the supporting portion 4308 extends. Accordingly, the signal line driver circuit 4323 thus provided does not prevent bending in the direction which is perpendicular or substantially perpendicular to the supporting portion 4308 and the occurrence of breaking of the signal line driver circuit 4323 of can be prevented. Further, the scanning line driver circuit 4321, which is provided at the edge portion of the display panel in a direction parallel or substantially parallel to the supporting portion 4308, can be manufactured through the same process as the process for manufacturing the display portion, which leads to cost reduction and reduction of leading of a wiring to the display portion as compared to the case where the scanning line driver circuit 4321 is provided for the supporting portion 4308. Note that a plurality of bending portions C and/or a plurality of non-bending portions D may be provided, and the bending portion C and the non-bending portion D may be provided alternately. A stress concentration region may be provided for the display panel, so that the bending portion C and the non-bending portion D may be formed artificially.

Figure 8A:
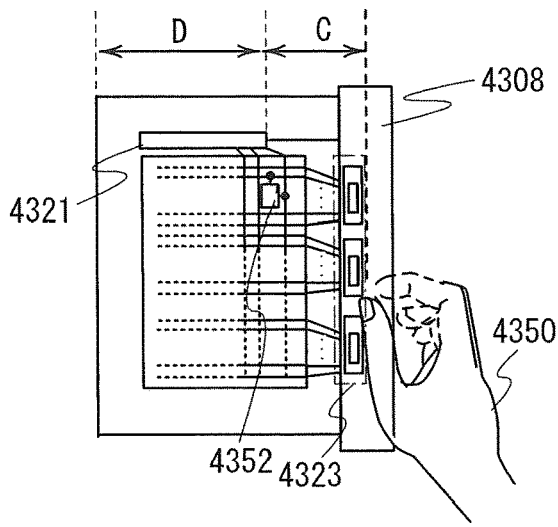
FIGS. 8A to 8C each illustrate one mode of a display device of the present invention.
Figure 8B:
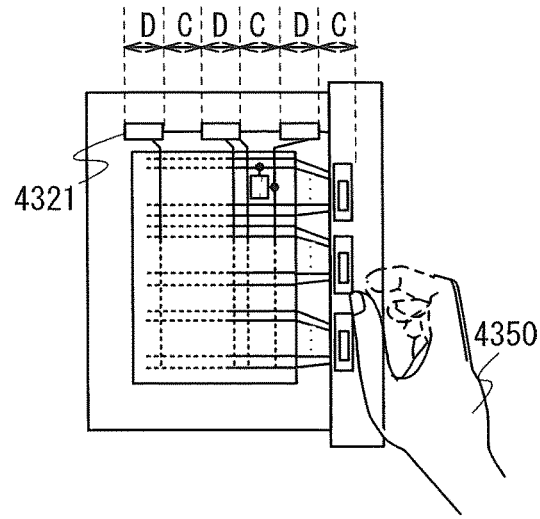
Figure 8C:
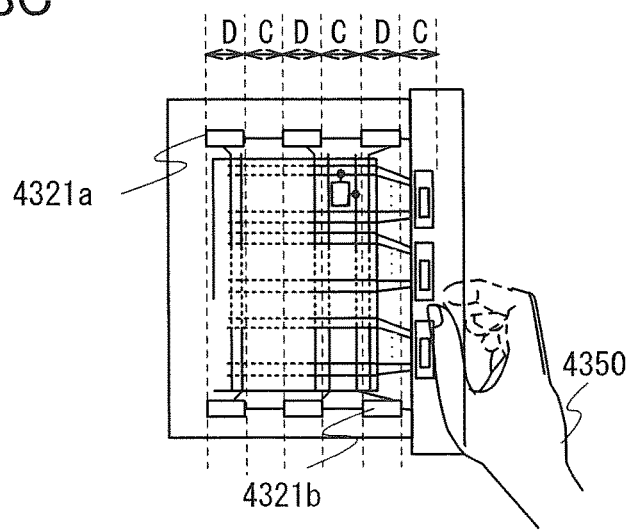

Next, description is made on the arrangement of the scanning line driver circuit 4321 with respect to the bending portion C and the non-bending portion D. FIGS. 8A to 8C are, similarly to FIG. 7A, front plane views at the time when the display device is used.

In FIG. 8A, description is made on the case where the bending portion C is positioned on the side which is near the supporting portion 4308 and the non-bending portion D is positioned on the side which is far from the supporting portion 4308. Therefore, the scanning line driver circuit 4321 is provided such that the non-bending portion D is positioned on the side which is far from the supporting portion 4308. A scanning signal may be supplied to a pixel TFT 4352 in the display portion by leading of a wiring extended from the scanning line driver circuit 4321, to each scanning line of the display portion. A control signal such as a clock signal for driving the scanning line driver circuit 4321 may be supplied through a wiring extended from an image signal generating circuit in the supporting portion 4308. A wiring for electrical connection between circuits is formed by microfabrication of a metal film or the like, and a semiconductor film of a transistor included in the scanning line driver circuit is formed using a semiconductor material such as a silicon film. The ductility of a metal film is higher than that of a semiconductor material, and the metal film is less damaged than the semiconductor material by bending. Therefore, a wiring which is connected to the scanning line driver circuit is provided in a portion corresponding to the bending portion C and the transistor included in the scanning line driver circuit is provided in a portion corresponding to the non-bending portion D, whereby damage on the semiconductor film of the transistor caused by bending can be suppressed. Accordingly, by arranging the scanning line driver circuit 4321 as shown in FIG. 8A, occurrence of breaking of a circuit at the time when a user uses the display device with his/her hand 4350 can be suppressed.

Shown in FIG. 8B is a structure in which the bending portions C and the non-bending portions D are provided alternately from the side which is near the supporting portion 4308 to the side which is far from there. Therefore, the scanning line driver circuit 4321 is provided by providing a driver circuit into a plurality of circuit portions of driver circuits and disposing them to be spaced from each other in the non-bending portions B. A scanning signal may be supplied to the pixel TFT 4352 in the display portion by leading of a wiring extended from the scanning line driver circuit 4321. A control signal such as a clock signal for driving the scanning line driver circuit 4321 may be supplied through a wiring extended from an image signal generating circuit in the supporting portion 4308. A signal which is transmitted between pulse signal generating circuits such as flip flops included in the scanning line driver circuit may be supplied through a wiring. A wiring for electrical connection between circuits is formed by microfabrication of a metal film or the like, and a semiconductor film of a transistor included in the scanning line driver circuit is formed using a semiconductor material such as a silicon film. The ductility of a metal film is higher than that of a semiconductor material, and the metal film is less damaged than the semiconductor material by bending. Therefore, a wiring which is connected to the scanning line driver circuit is provided in a portion corresponding to the bending portion C and the transistor included in the scanning line driver circuit is provided in a portion corresponding to the non-bending portion D, whereby damage on the semiconductor film of the transistor caused by bending can be decreased. Further, in FIG. 8B, the driver circuit is divided into a plurality of circuit portions of driver circuits and they are provided to be spaced from each other, whereby a stress which is applied to the scanning line driver circuit at the time of bending can be dispersed. Accordingly, by arranging the scanning line driver circuit 4321 as shown in FIG. 8B, occurrence of breaking of a circuit at the time when a user uses the display device with his/her hand 4350 can be suppressed more effectively.

In FIG. 8B, the scanning line driver circuits 4321 may be provided for an upper portion and a bottom portion of the display portion of the scanning line driver circuit 4321, as the scanning line driver circuit 4321a and the scanning line driver circuit 4321b so as to make redundant or spread the function for outputting a scanning signal. FIG. 8C is a view of the display panel in which the scanning line driver circuits are provided for an upper portion and a bottom portion of the display panel. Scanning signals supplied to the pixel TFTs 4352 are supplied by the scanning line driver circuit 4321a and the scanning line driver circuit 4321b provided for the upper portion and the bottom portion of the display panel, whereby a pulse signal generating circuit such as a flip flop included in the scanning line driver circuit can be reduced; accordingly, the occurrence of breaking of a circuit at the time when a user uses the display device with his/her hand 4350 can be suppressed.

Through the above, illustrating specific examples in FIGS. 8B and 8C, an advantage of the case where a scanning line driver circuit is not provided in the region corresponding to the bending portion C but provided in the region corresponding to the non-bending portion D is described. With these structures, a stress which is applied to the scanning line driver circuit at the time of bending can be dispersed, so that the occurrence of breaking of a circuit at the time when a user uses the display device with his/her hand 4350 can be suppressed.

Figure 9A:
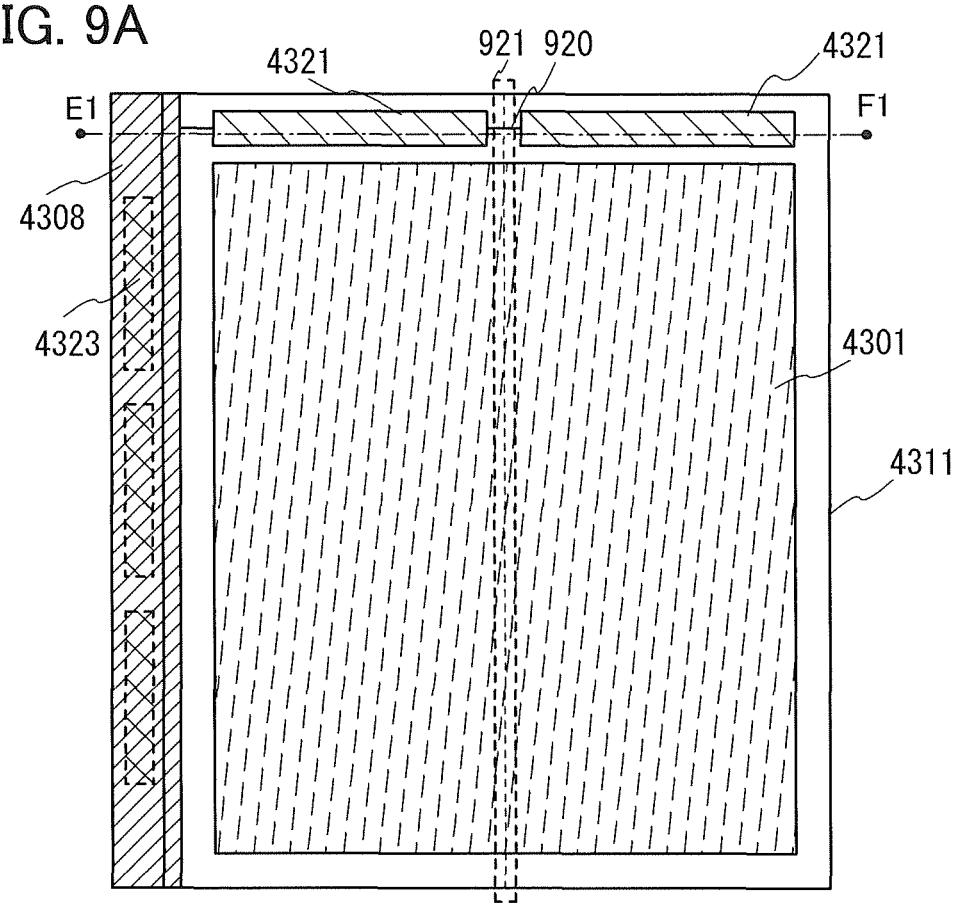
FIGS. 9A to 9C illustrate one mode of a display device of the present invention.
Figure 9B:
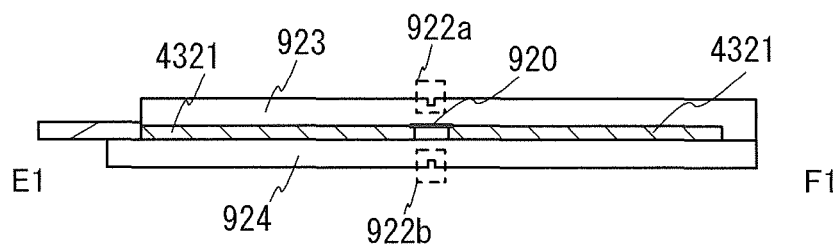
Figure 9C:
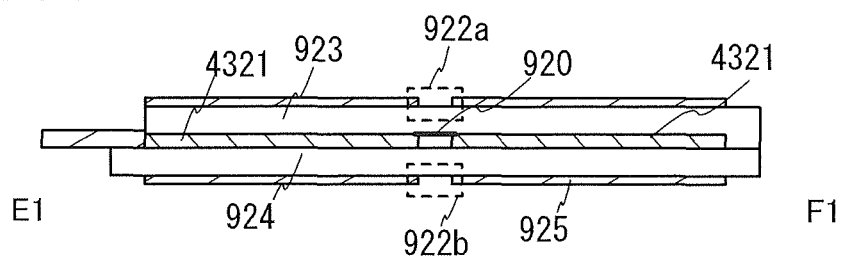
Figure 10A:
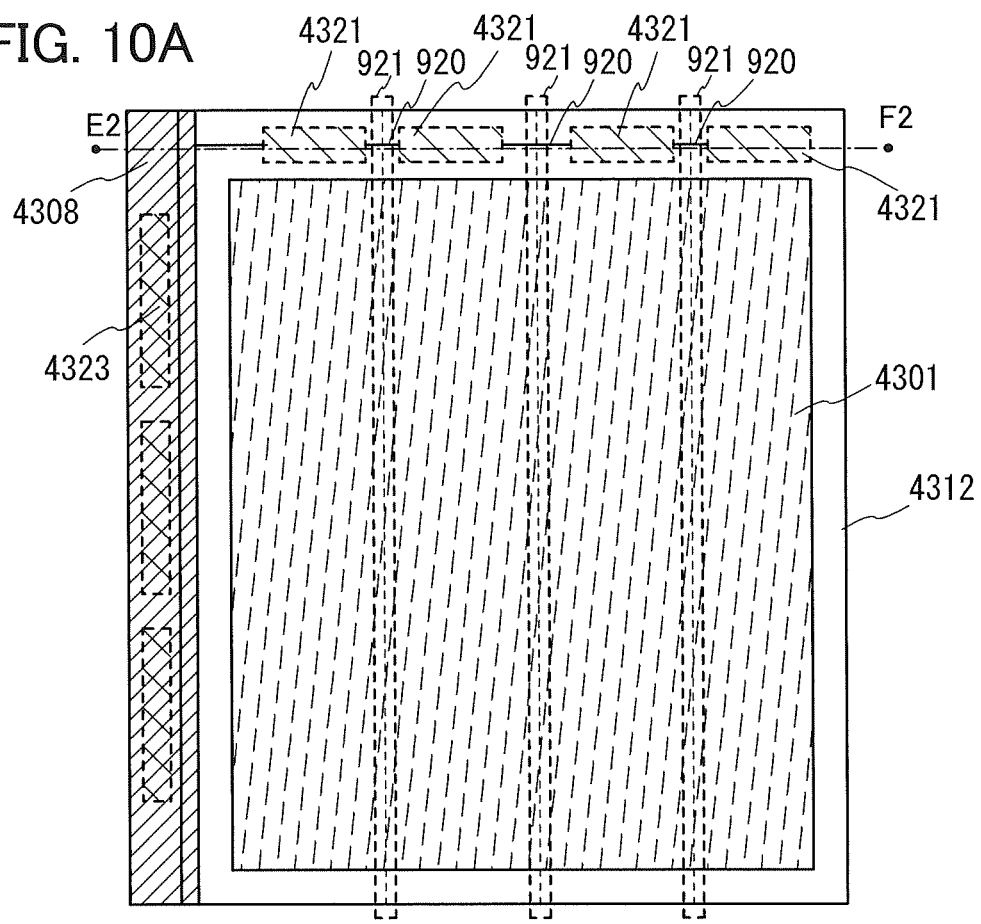
FIGS. 10A to 10C illustrate one mode of a display device of the present invention.
Figure 10B:
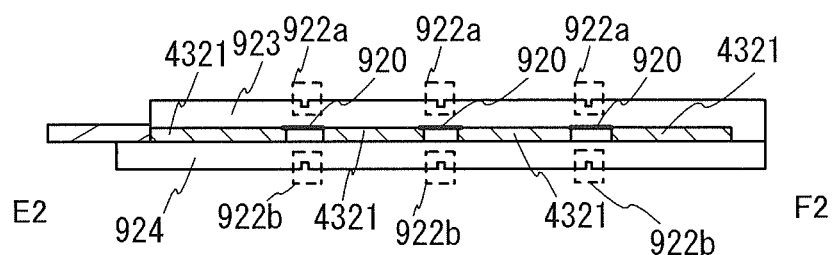
Figure 10C:
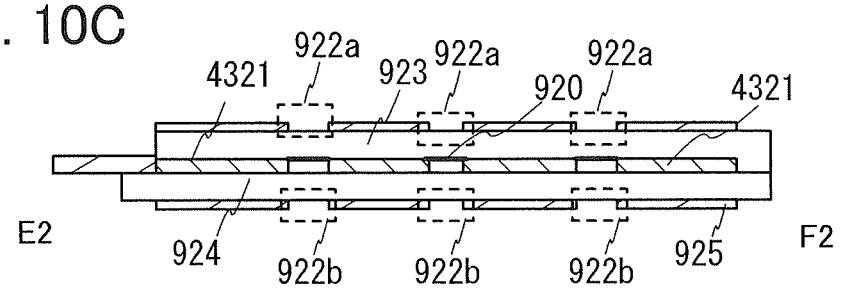

Next, examples in which a stress concentration region for artificially forming the bending portion C and the non-bending portion D in the display panel in the case where the driver circuit is divided into a plurality of circuit portions of scanning line driver circuits and they are spaced from each other as illustrated in FIGS. 8B and 8C are illustrated in FIGS. 9A to 9C and FIGS. 10A to 10C. FIG. 9A is a plane view of the display device, FIGS. 9B and 9C are examples of a cross-sectional view along line E1-F1 of FIG. 9A. FIG. 10A is a plane view of the display device, FIGS. 10B and 10C are examples of a cross-sectional view along line E2-F2 of FIG. 10A.

In FIG. 9A, the display panel 4311, the supporting portion 4308, the display portion 4301, the scanning line driver circuit 4321, and the signal line driver circuit 4323 are shown. The scanning line driver circuit 4321 is divided into two circuit portions of scanning line driver circuits, and they are spaced from each other with a wiring 920 interposed therebetween. It is preferable that a stress concentration region 921 be formed to overlap the wiring 920. FIG. 9B is a cross-sectional view in a direction perpendicular to the supporting portion; as an example, a cut portion 922a and a cut portion 922b are provided for a sealing substrate 923 and an element substrate 924 respectively in the stress concentration region 921 which overlaps the wiring 920. As shown in FIG. 9C, a reinforcing plate 925 may be attached onto the scanning line driver circuit 4321 of the element substrate 924 and the sealing substrate 923, so that the cut portion 922a and the cut portion 922b are formed. The cut portion 922a and the cut portion 922b may be provided so as to be parallel to the long-axis direction of the supporting portion 4308, or may be provided partly.

The stress concentration region means a region where a stress formed by deformation of a material due to cutting or the like, change of the strength against bending and/or extension due to attachment of a material or the like, or the like is concentrated.

Division of the scanning line driver circuit means a division of a region where a layout including a circuit element such as a TFT and a wiring is repeated, by a region for leading of a wiring.

In FIG. 10A, similarly to FIG. 9A, the display panel 4311, the supporting portion 4308, the display portion 4301, the scanning line driver circuit 4321, and the signal line driver circuit 4323 are shown. The signal line driver circuit 4323 is provided by being divided into four circuit portions of signal line driver circuits and by disposing them so as to be spaced from each other with the wiring 920 interposed therebetween. It is preferable that the stress concentration region 921 be formed to overlap the plurality of wirings 920. FIG. 10B is a cross-sectional view in a direction perpendicular to the supporting portion; as an example, a plurality of cut portions 922a and a plurality of cut portions 922b are provided for the sealing substrate 923 and the element substrate 924 respectively in the stress concentration regions 921 which overlap the wirings 920. As shown in FIG. 10C, the reinforcing plate 925 may be attached onto the scanning line driver circuit 4321 of the element substrate 924 and the sealing substrate 923, so that the plurality of cut portions 922a and the plurality of cut portions 922b are formed. The plurality of cut portions 922a and the plurality of cut portions 922b may be provided so as to be parallel to the long-axis direction of the supporting portion 4308, or may be provided partly.

The division numbers of the scanning line driver circuits shown in FIGS. 9A to 9C and FIGS. 10A to 10C are examples for description; the scanning line driver circuit is divided as appropriate to be provided.

As described above, according to one structure of this embodiment, occurrence of breaking of a scanning line driver circuit at the time when a display device is used can be suppressed more effectively. Further, according to one structure of this embodiment, a stress concentration region is provided for a display panel by a cut portion or the like in advance, so that occurrence of breaking of a scanning line driver circuit can be suppressed more effectively.

Embodiment 3 can be implemented in appropriate combination with any structure described in the other embodiments.

Embodiment 4

In Embodiment 4, an example of a display panel provided for a display device is described. A variety of display panels including any display element can be applied, and the display panel may be either a passive-matrix type or an active-matrix type.

As the display panel, an electronic paper, a light-emitting display panel (electroluminescence panel), a liquid crystal display panel, or the like can be used. The display panel is a panel in which a display element is sealed, and to which a connector such as a flexible printed circuit (FPC), tape automated bonding (TAB) tape, or a tape carrier package (TCP) is attached and an external circuit including a signal line driver circuit is electrically connected. An IC including a signal line driver circuit may be mounted onto the display panel by chip on glass (COG).

As the display panel 4311, either a dual-display panel in which display is performed on both sides or a single-sided display panel in which display is performed on one side may be used. As the dual-display type panel, a dual-emission type display panel may be used or two one-side-emission type display panels may be attached to be used. Two liquid crystal display panels with a backlight (preferably a thin EL panel) provided therebetween may be used.

Figure 11A:
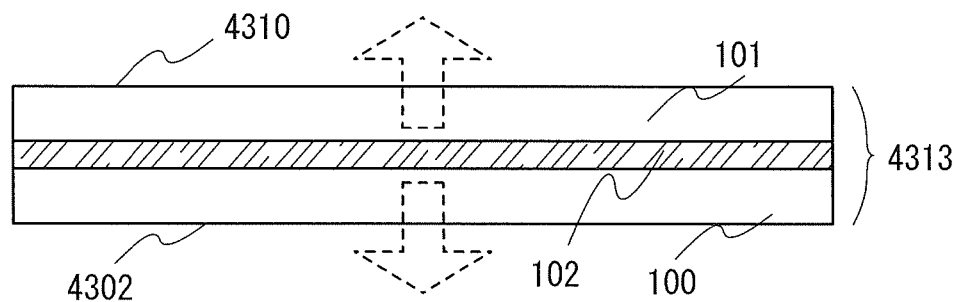
FIGS. 11A to 11C each illustrate one mode of a display panel of the present invention.
Figure 11B:
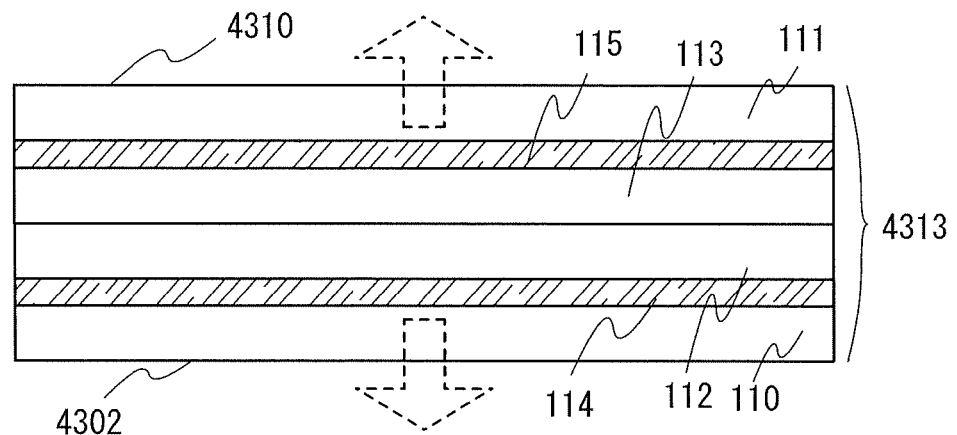
Figure 11C:
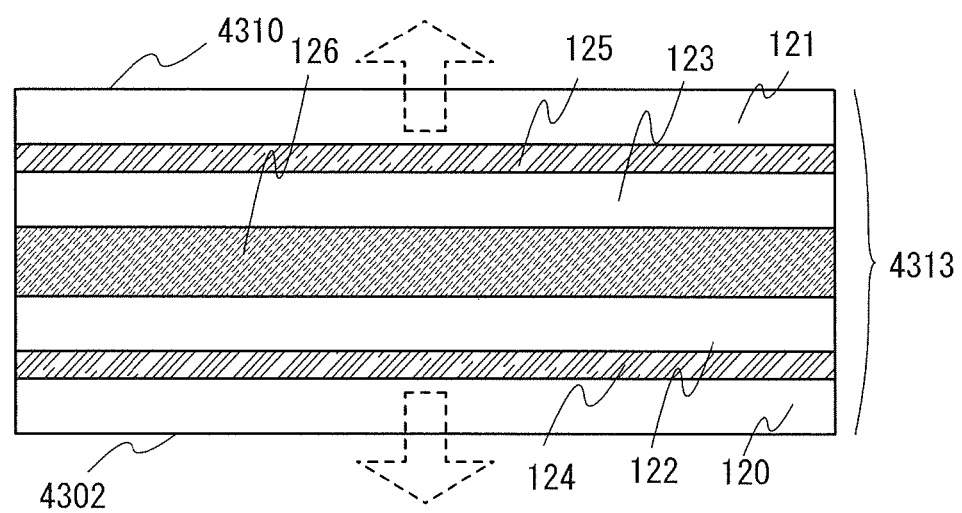

Examples of the dual-display type panel which is applicable to the display panel 4311 are illustrated in FIGS. 11A to 11C. Note that in FIGS. 11A to 11C, each arrow indicates a direction in which light emission is extracted.

FIG. 11A illustrates a display panel 4313 in which a display element 102 is provided between a substrate 100 and a substrate 101, and a first display portion 4302 and a second display portion 4310 are provided on the substrate 100 side and the substrate 101 side, respectively. Display is performed on the first display portion 4302 and the second display portion 4310 by the display element 102; therefore, the substrates 100 and 101 have light-transmitting properties. It is preferable that an EL element that is a self-luminous light-emitting element be used as the display element 102. In the case of using light entering the display panel 4313, a liquid crystal display element or an electrophoretic display element can be used as the display element 102.

FIG. 11B illustrates a display panel 4313 in which a single-sided-display panel in which a display element 114 is provided between a substrate 110 and a substrate 112 and a single-sided-display panel in which a display element 115 is provided between a substrate 111 and a substrate 113 are stacked, and the first display portion 4302 and the second display portion 4310 are provided on the substrate 100 side and the substrate 101 side, respectively. Display is performed on the first display portion 4302 and the second display portion 4310 by the display element 114 and the display element 115, respectively; therefore, the substrates 110 and 111 have light-transmitting properties. To the contrary, the substrate 112 and the substrate 113 do not necessarily have light-transmitting properties but may have light-reflecting properties. The single-sided-display panels may be attached to each other by bonding the substrates 112 and 113 with a bonding layer. Either one of the substrate 112 and the substrate 113 may be provided.

It is preferable that EL elements be used as the display element 114 and the display element 115. In the case of using light entering the display panel 4313, a liquid crystal display element or an electrophoretic display element can be used as each of the display element 114 and the display element 115. In order to enhance the light extraction efficiency, a reflective display panel is preferably used as the single-sided-display panel.

A backlight may be provided between light-transmissive liquid crystal display panels, so that the display panel 4313 is formed. FIG. 11C illustrates a display panel 4313 in which a light-transmissive liquid crystal display panel in which a display element 124 is provided between a substrate 120 and a substrate 122 and a light-transmissive liquid crystal display panel in which a display element 125 is provided between a substrate 121 and a substrate 123 are stacked with a backlight 126 which functions as a light source provided therebetween, and the first display portion 4302 and the second display portion 4310 are provided on the substrate 120 side and the substrate 121 side, respectively. Display is performed on the first display portion 4302 by light from the backlight 126 and the display element 124 and display is performed on the second display portion 4310 by light from the backlight 126 and the display element 125; therefore, the substrates 120, 121, 122, and 123 have light-transmitting properties.

The attachment of the backlight may be performed by bonding using a bonding layer. Either one of the substrate 122 and the substrate 123 may be provided. It is preferable that a thin EL panel be used as the backlight 126 because the thickness of the display panel 4313 can be reduced.

In the case of a single-sided-display panel, it is preferable that a non-light-transmissive or reflective housing be provided on the side on which a display portion is not provided because the display panel can be reinforced.

Modes of the display panel are described below using FIGS. 12A and 12B, 13, 14, and 16. FIGS. 12A and 12B, 13, 14, and 16 correspond to cross-sectional views along line M-N in FIG. 4A. FIGS. 12A and 12B, 13, 14, and 16 are examples of the case where the FPC 4324 is attached to the display panel 4311 including the display portion 4301 including a pixel circuit and the scanning line driver circuit 4321a; the display portion 4301 and the scanning line driver circuit 4321a provided over the element substrate 4331 are sealed with the sealing substrate 4332 by a sealant 4005.

As shown in FIGS. 12A and 12B, and FIGS. 13, 14, and 16, the display panel 4311 includes a connection terminal electrode 4015 and a terminal electrode 4016, and the connection terminal electrode 4015 and the terminal electrode 4016 are electrically connected to a terminal included in the FPC 4324 through an anisotropic conductive film 4019.

The connection terminal electrode 4015 is formed using the same conductive film as a first electrode layer 4030, and the terminal electrode 4016 is formed using the same conductive film as each of the source and drain electrode layers included in thin film transistors 4010 and 4011.

Further, as shown in FIGS. 4A to 4C, the signal line driver circuit 4323 formed using a single crystal semiconductor film or a polycrystal semiconductor film over a substrate is mounted by an FPC so as to be provided for the supporting portion 4308. Various signals and potentials are supplied to the signal line driver circuit 4323, the scanning line driver circuit 4321*a*, and the display portion 4301 from the FPC 4324.

Note that there is no particular limitation on the connection method of the signal line driver circuit 4323: a COG method, a wire bonding method, a TAB method, or the like can be used.

The display portion 4301 and the scanning line driver circuit 4321*a* which are provided over the element substrate 4331 each include a plurality of thin film transistors; in FIGS. 12A and 12B, and FIGS. 13, 14, and 16, the thin film transistor 4010 included in the display portion 4301 and the thin film transistor 4011 included in the scanning line driver circuit 4321*a* are illustrated. Over the thin film transistors 4010 and 4011, insulating layers 4020 and 4021 are provided. An insulating film 4023 is an insulating film serving as a base film.

A variety of thin film transistors can be applied to the thin film transistors 4010 and 4011 without particular limitation. FIGS. 12A and 12B, and FIGS. 13, 14, and 16 each illustrate an example in which inverted-staggered thin film transistors having a bottom-gate structure are used as the thin film transistors 4010 and 4011. Although the thin film transistors 4010 and 4011 are channel-etched thin film transistors in the drawings, a channel-protective inverted-staggered thin film transistor in which a channel protective film is provided over a semiconductor layer may be used.

In the display panel, the thin film transistor 4010 included in the display portion 4301 is electrically connected to a display element. A variety of display elements can be used as the display element as long as display can be performed.

As a display panel, an electronic paper can be used. As for the electronic paper, there are many types: an electric field, a magnetic field, light, heat, or the like is used in an image writing method; and a change of a form or a position, a physical change, or the like is used as for a change of a display medium. For example, a twist ball-type, an electrophoresis type, a powder system type (also called a toner display), a liquid crystal type, and the like can be given as examples thereof.

Figure 16:
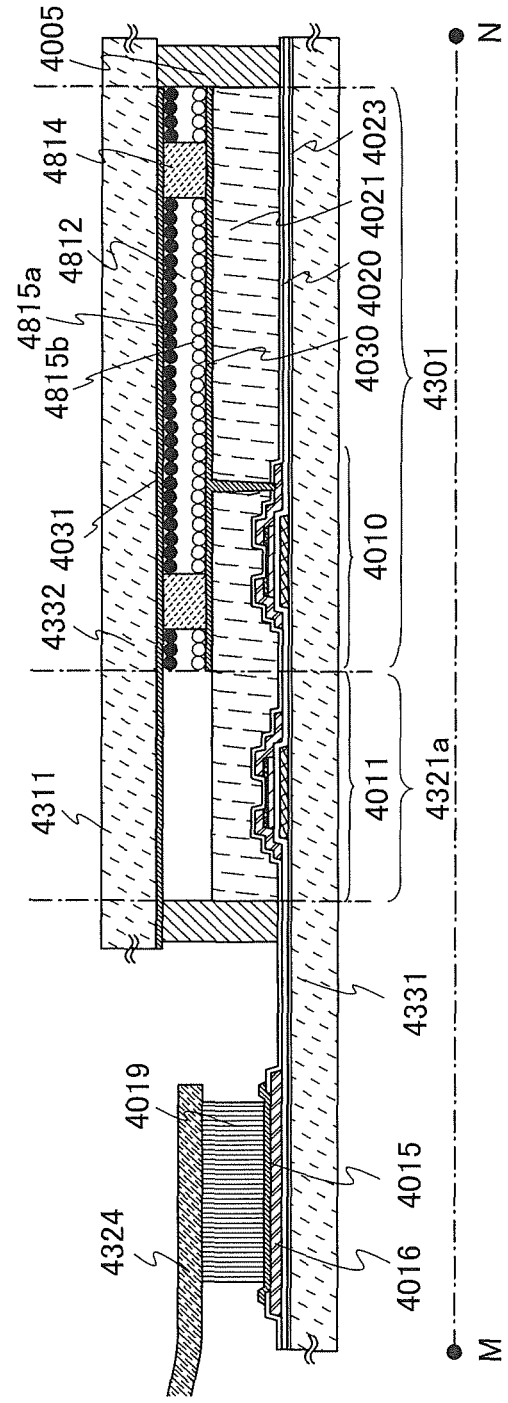
FIG. 16 illustrates one mode of a display panel of the present invention.

FIGS. 12A and 12B and FIG. 16 illustrate examples of the case where an active-matrix electronic paper is used as the display panel 4311. Electronic paper has advantages such as readability which is as high as that of paper media, low power consumption compared to other display panels, and thin light form.

FIGS. 12A and 12B and FIG. 16 illustrate active-matrix electronic papers as examples of the display panel.

The electronic paper in FIG. 12A is an example of a display device using a twist ball display method. The twist ball display method refers to a method in which spherical particles each colored in black and white are arranged between electrode layers included in a display element, and a potential difference is generated between the electrode layers to control the orientation of the spherical particles, so that display is performed.

Between the first electrode layer 4030 connected to the thin film transistor 4010 and a second electrode layer 4031 provided for the sealing substrate 4332, spherical particles 4613 each of which includes a black region 4615*a*, a white region 4615*b*, and a cavity 4612 which is filled with liquid around the black region 4615*a* and the white region 4615*b*, are provided. A space around the spherical particles 4613 is filled with a filler 4614 such as a resin. The second electrode layer 4031 corresponds to a common electrode (counter electrode). The second electrode layer 4031 is electrically connected to a common potential line.

Instead of the twist ball, an electrophoretic element can be used. An example of the case where an electrophoretic element is used as a display element is illustrated in FIG. 12B. Microcapsules 4713 each having a diameter of about 10 μm to 200 μm, in which transparent liquid 4712, negatively charged black microparticles 4715*a* as first particles, and positively charged white microparticles 4715*b* as second particles are encapsulated, are used.

In the microcapsules 4713 provided between the first electrode layer 4030 and the second electrode layer 4031, when an electric field is applied by the first electrode layer 4030 and the second electrode layer 4031, the white microparticles 4715*b* and the black microparticles 4715*a* move to opposite directions to each other, so that white or black can be displayed. A display element using this principle is an electrophoretic display element. The electrophoretic display element has high reflectivity, and thus, an auxiliary light is not needed, power consumption is low, and a display portion can be recognized in a dim place. In addition, even when power is not supplied to the display portion, an image which has been displayed once can be maintained. Accordingly, a displayed image can be stored even when the display panel is distanced from an electric wave source.

Note that the first particle and the second particle each contain pigment and do not move without an electric field. Moreover, the colors of the first particle and the second particle are different from each other (the color of either one of them may be colorless).

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can be performed.

Note that the first particles and the second particles in the microcapsules may be formed using a single material selected from a conductive material, an insulating material, a semiconductor material, a magnetic material, a liquid crystal material, a ferroelectric material, an electroluminescent material, an electrochromic material, and a magnetophoretic material, or a composite material of any of these.

Electronic Liquid Powder (registered trademark) can be used for an electronic paper using liquid powders. An example of the case where an electronic liquid powder is used as the display element is illustrated in FIG. 16. Positively charged black liquid powders 4815*a* and negatively charged white liquid powders 4815*b* are contained in a space 4812 segmented by the first electrode layer 4030, the second electrode layer 4031, and a rib 4814. The space 4812 is filled with air.

When an electric field is applied by the first electrode layer 4030 and the second electrode layer 4031, the black liquid powders 4815*a* and the white liquid powders 4815*b* move in opposite directions to each other, so that white or black can be displayed. As the liquid powders, color powders of red, yellow, and/or blue may be used.

A light-emitting element using electroluminescence (an EL element) may be used as the display element. Light-emitting elements using electroluminescence are classified according to whether a light-emitting material is an organic compound or an inorganic compound; in general, the former is called an organic EL element, and the latter is called an inorganic EL element.

In an organic EL element, voltage is applied to a light-emitting element, so that electrons and holes are injected from a pair of electrodes into a layer containing a light-emitting organic compound, whereby current flows. The carriers (electrons and holes) are recombined, and thus, the light-emitting organic compound is excited. The light-emitting organic compound returns to a ground state from the excited state, thereby emitting light. Owing to such a mechanism, this light-emitting element is called a current-excitation light-emitting element.

Inorganic EL elements are classified according to their element structures into a dispersion-type inorganic EL element and a thin-film inorganic EL element. A dispersion-type inorganic EL element includes a light-emitting layer in which particles of a light-emitting material are dispersed in a binder, and its light emission mechanism is donor-acceptor recombination type light emission that uses a donor level and an acceptor level. A thin-film inorganic EL element has a structure where a light-emitting layer is sandwiched between dielectric layers, which are further sandwiched between electrodes, and its light emission mechanism is localized type light emission that uses inner-shell electron transition of metal ions. Description is made here using an organic EL element as a light-emitting element.

In order to extract light emitted from the light-emitting element, at least one of the pair of electrodes is transparent. A thin film transistor and a light-emitting element are formed over a substrate. Any of light-emitting elements having the following structures can be applied: a top emission structure in which light emission is extracted through the surface opposite to the substrate; a bottom emission structure in which light emission is extracted through the surface on the substrate side; a dual emission structure in which light emission is extracted through the surface opposite to the substrate and the surface on the substrate side; and the like.

Figure 13:
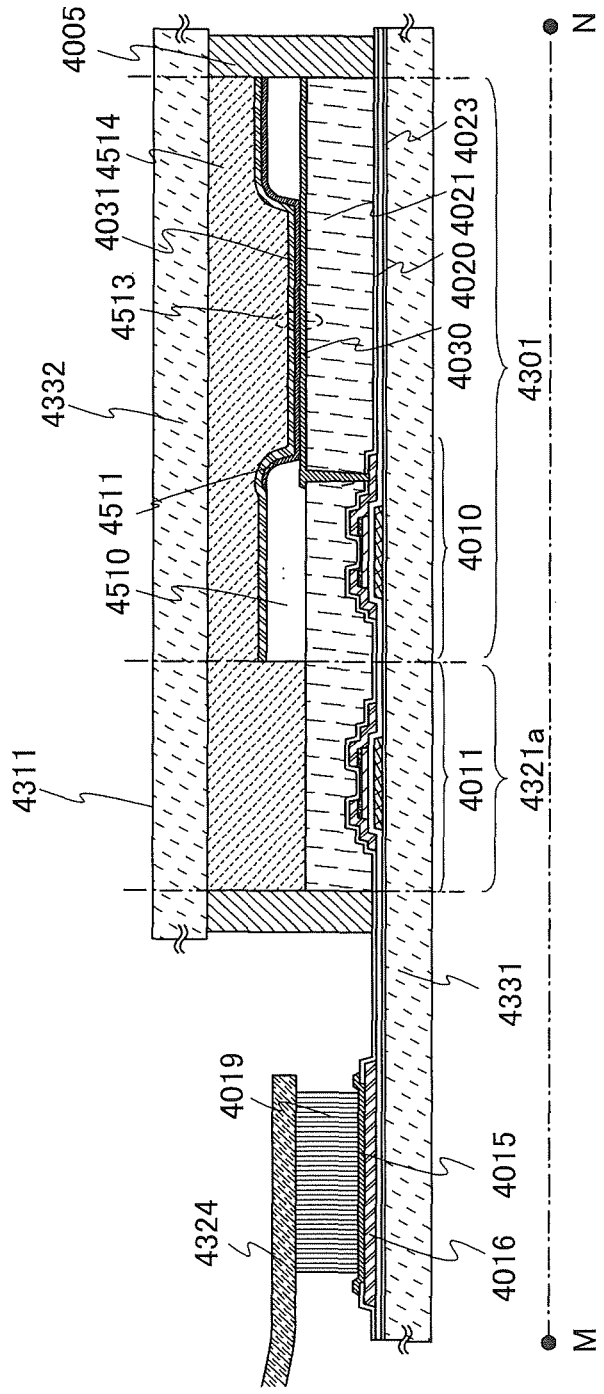
FIG. 13 illustrates one mode of a display panel of the present invention.

An example of the case where a light-emitting display panel (EL panel) is used as the display panel 4311 is illustrated in FIG. 13. A light-emitting element 4513 which is a display element is electrically connected to the thin film transistor 4010 provided in the display portion 4301. A structure of the light-emitting element 4513 is not limited to the stacked-layer structure shown in FIG. 13, including the first electrode layer 4030, an electroluminescent layer 4511, and the second electrode layer 4031. The structure of the light-emitting element 4513 can be changed as appropriate depending on a direction in which light is extracted from the light-emitting element 4513, or the like.

A partition wall 4510 is formed using an organic resin film, an inorganic insulating film, or organic polysiloxane. It is particularly preferable that the partition wall 4510 be formed using a photosensitive material to have an opening portion over the first electrode layer 4030 so that a sidewall of the opening portion is formed as a tilted surface with continuous curvature.

The electroluminescent layer 4511 may be formed using a single layer or a plurality of layers stacked.

A protective film may be formed over the second electrode layer 4031 and the partition wall 4510 in order to prevent entry of oxygen, hydrogen, moisture, carbon dioxide, or the like into the light-emitting element 4513. As the protective film, a silicon nitride film, a silicon nitride oxide film, a DLC film, or the like can be formed. A filler 4514 is provided in a space sealed with the element substrate 4331, the sealing substrate 4332, and the sealant 4005 so as to seal closely. It is preferable that a panel be packaged (sealed) with a protective film (such as a laminate film or an ultraviolet curable resin film) or a cover material with high air-tightness and little degasification so that the panel is not exposed to the outside air, in this manner.

As the filler 4514, an ultraviolet curable resin or a thermosetting resin can be used as well as an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. For example, nitrogen is used for the filler.

In addition, if needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, the polarizing plate or the circularly polarizing plate may be provided with an anti-reflection film. For example, anti-glare treatment by which reflected light is diffused by roughness on the surface so as to reduce the glare can be performed.

Figure 14:
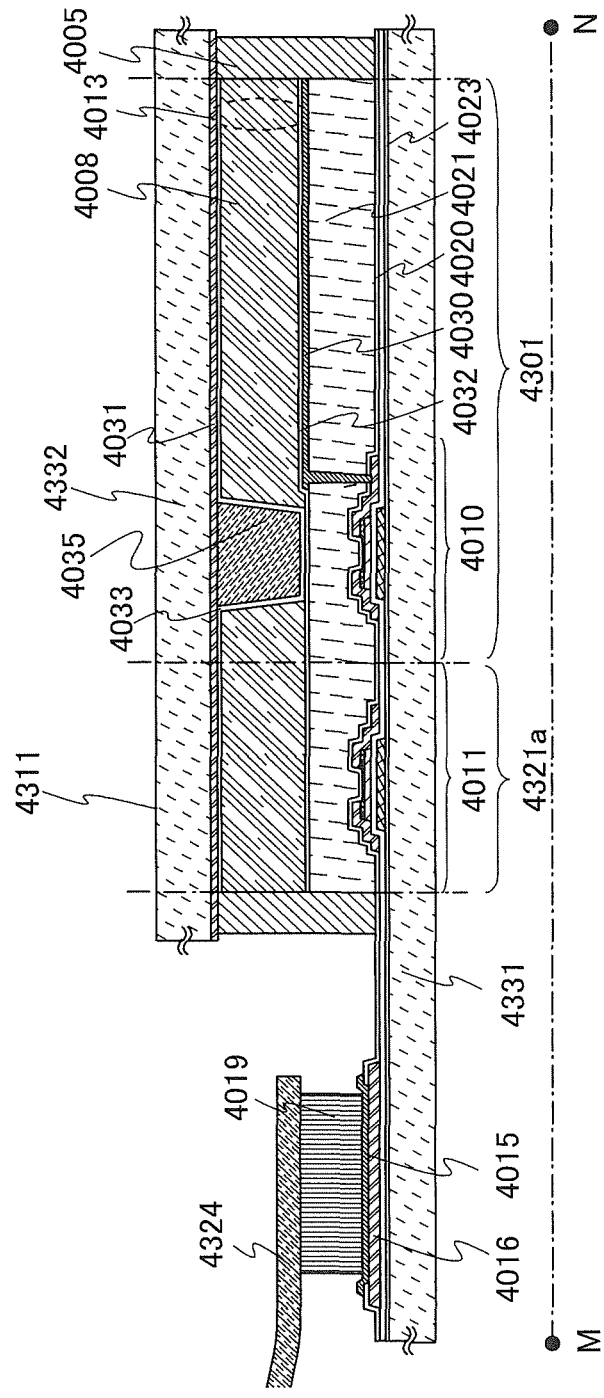
FIG. 14 illustrates one mode of a display panel of the present invention.
Figure 15A:
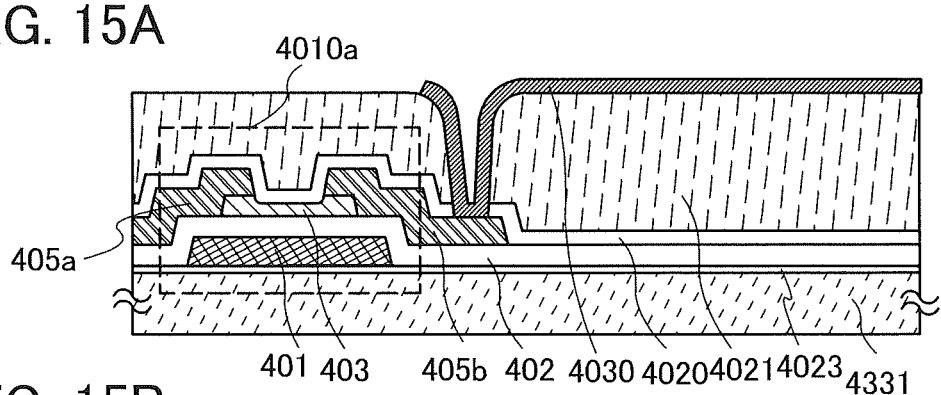
FIGS. 15A to 15D each illustrate one mode of a transistor applicable to a display device of the present invention.
Figure 15B:
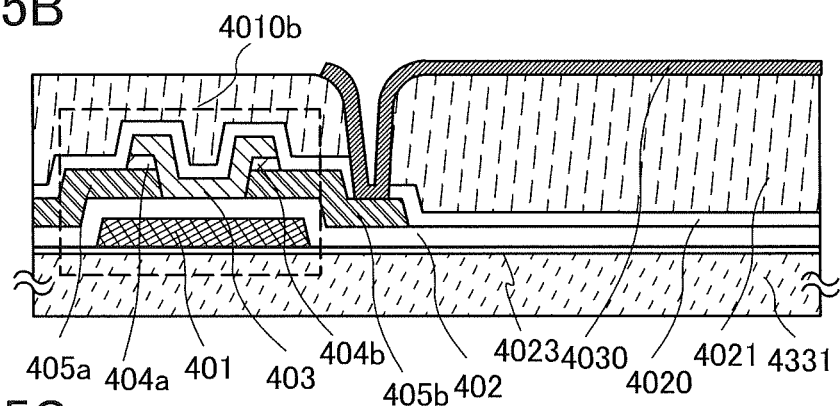
Figure 15C:
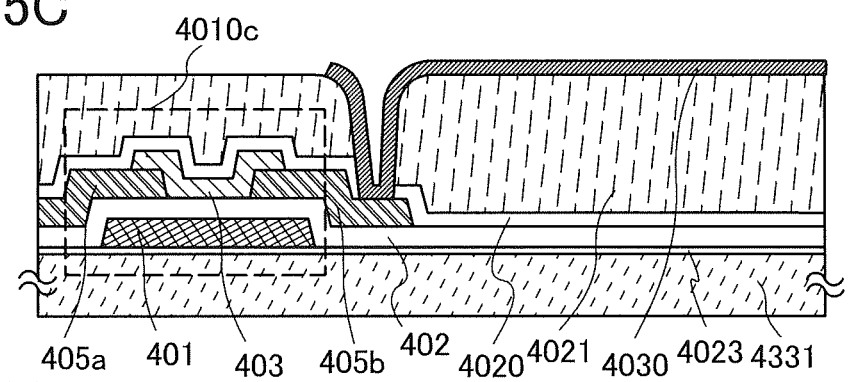
Figure 15D:
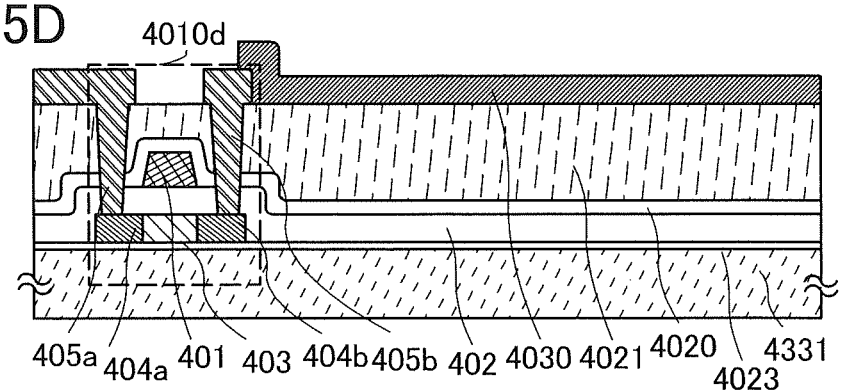

An example of the case where a liquid crystal display panel is used as the display panel 4311 is illustrated in FIG. 14. In FIG. 14, a liquid crystal element 4013 which is a display element includes the first electrode layer 4030, the second electrode layer 4031, and a liquid crystal layer 4008. Insulating films 4032 and 4033 serving as orientation films are provided to hold the liquid crystal layer 4008 therebetween. The second electrode layer 4031 is provided on the sealing substrate 4332 side, and the first electrode layer 4030 and the second electrode layer 4031 are stacked with the liquid crystal layer 4008 provided therebetween.

Reference numeral 4035 indicates a columnar spacer formed by selectively etching the insulating film, and the columnar spacer 4035 is provided in order to control the thickness of the liquid crystal layer 4008 (a cell gap). A spherical spacer may be used as well.

Although not shown in the liquid crystal display device in FIG. 14, a color filter (a coloring layer), a black matrix (a light-shielding layer), an optical member (an optical substrate) such as a polarizing member, a retardation member, or an anti-reflection member, and the like are provided as appropriate. For example, circular polarization by using a polarizing substrate and a retardation substrate may be used. A backlight, a side light, or the like may be used as a light source; as the backlight, it is preferable to use an EL panel in the point of small thickness.

Liquid crystal exhibiting a blue phase for which an alignment film is not needed may be used. A blue phase is one of liquid crystal phases, which is generated before a cholesteric phase changes into an isotropic phase while temperature of cholesteric liquid crystal is increased. Since the blue phase is generated within a narrow range of temperature, liquid crystal composition containing a chiral agent at 5 wt % or more so as to improve the temperature range is used for the liquid crystal layer 4008. The liquid crystal composition which includes liquid crystal exhibiting a blue phase and a chiral agent has a response time as short as 10 μs to 100 μs. Further, the liquid crystal composition has optical isotropy. Therefore, an alignment treatment is not needed and the dependency on the viewing angle is less.

Although FIG. 14 illustrates the example of a light-transmissive liquid crystal display panel, the present invention can also be applied to a reflective liquid crystal display panel or a light-semi-transmissive liquid crystal display panel.

In FIGS. 12A and 12B, and FIGS. 13, 14, and 16, a plastic having light-transmitting properties can be used as each of the element substrate 4331 and the sealing substrate 4332. As the plastic, a fiberglass-reinforced plastics (FRP) plate, a polyvinyl fluoride (PVF) film, a polyester film, or an acrylic resin film can be used. A sheet with a structure in which an aluminum foil is sandwiched between PVF films or polyester films can be used.

The insulating layer 4020 serves as a protective film of a thin film transistor.

The protective film is provided to prevent entry of contaminant impurities such as organic substance, metal, or moisture existing in the air and is preferably a dense film. The protective film may be formed using a single layer of a silicon oxide film, a silicon nitride film, a silicon oxynitride film, a silicon nitride oxide film, an aluminum oxide film, an aluminum nitride film, an aluminum oxynitride film, or an aluminum nitride oxide film, or a stacked layer thereof by a sputtering method.

The insulating layer 4021 serving as a planarizing insulating film can be formed using an organic material having heat resistance, such as acrylic, polyimide, benzocyclobutene, polyamide, or epoxy. Other than such organic materials, it is also possible to use a low-dielectric constant material (a low-k material), a siloxane-based resin, phosphosilicate glass (PSG), borophosphosilicate glass (BPSG), or the like. The insulating layer may be formed by stacking a plurality of insulating films using any of these materials.

There is no particular limitation on the method for forming the insulating layers 4020 and 4021: depending on a material thereof, sputtering, an SOG method, spin coating, dipping, spray coating, a droplet discharging method (e.g., an ink-jet method, screen printing, or offset printing), a doctor knife, a roll coater, a curtain coater, a knife coater, or the like can be used. In the case where the insulating layer is formed using a material solution, the semiconductor layer may be annealed (at 200° C. to 400° C.) at the same time as a baking step; when the step of baking the insulating layer and the annealing of the semiconductor layer are performed at the same time, the display panel can be efficiently manufactured.

The display panel displays an image by light transmitted from a light source or a display element. Therefore, the substrates and the thin films such as insulating films and conductive films provided for the display portion where light is transmitted have light-transmitting properties with respect to light in the visible-light wavelength range.

The first electrode layer 4030 and the second electrode layer 4031 (each of which may be called a pixel electrode layer, a common electrode layer, a counter electrode layer, or the like) for applying voltage to the display element may have light-transmitting properties or light-reflecting properties, which depends on the direction in which light is extracted, the position where the electrode layer is provided, the pattern structure of the electrode layer, and the like.

The first electrode layer 4030 and the second electrode layer 4031 each can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

The first electrode layer 4030 and the second electrode layer 4031 each can be formed using one kind or plural kinds selected from metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a nitride thereof.

A conductive composition containing a conductive high molecule (also called a conductive polymer) can be included in the first electrode layer 4030 and the second electrode layer 4031. As the conductive high molecule, a so-called π-electron conjugated conductive polymer can be used. For example, polyaniline or a derivative thereof, polypyrrole or a derivative thereof, polythiophene or a derivative thereof, a copolymer of two or more kinds of them, and the like can be used.

Since, a thin film transistor is easily broken by static electricity or the like, a protection circuit for protecting a driver circuit is preferably provided. It is preferable that the protection circuit include a nonlinear element.

Embodiment 4 can be implemented in appropriate combination with any structure described in the other embodiments.

Embodiment 5

In Embodiment 5, examples of a material used for forming a display device and an element structure will be described in detail.

A signal line driver circuit is provided in a supporting portion, and therefore is not necessarily flexible. Accordingly, it is preferable that a semiconductor integrated circuit chip (IC) which is capable of high-speed operation and in which a semiconductor substrate (a semiconductor wafer) is used be used as the signal line driver circuit. As the semiconductor substrate, a single crystal semiconductor substrate or a polycrystalline semiconductor substrate can be used: for example, a semiconductor wafer such as a silicon wafer or a germanium wafer or a compound semiconductor wafer of gallium arsenide, indium phosphide, or the like is used.

Alternatively, a substrate (an SOI substrate) having an SOI structure in which a single crystal semiconductor layer is provided on an insulating surface may be used for the signal line driver circuit. The SOI substrate can be formed by a separation by implanted oxygen (SIMOX) method or a Smart-Cut (registered trademark) method. In the SIMOX method, oxygen ions are implanted into a single crystal silicon substrate to form a layer containing oxygen at a predetermined depth and heat treatment is performed, so that an embedded insulating layer is formed at a predetermined depth from the surface of the single crystal silicon substrate, whereby a single crystal silicon layer is formed on the embedded insulating layer. In the Smart-Cut (registered trademark) method, hydrogen ions are implanted into an oxidized single crystal silicon substrate to form a layer containing hydrogen at a predetermined depth, the oxidized single crystal silicon substrate is attached to another semiconductor substrate (such as a single crystalline silicon substrate having a silicon oxide film for attachment on its surface), and heat treatment is performed to separate the single crystal silicon substrate at the layer containing hydrogen, so that a stacked layer of the silicon oxide film and the single crystalline silicon layer is formed on the semiconductor substrate.

As a semiconductor element provided in a circuit portion of the display device, not only a field-effect transistor but also a memory element which uses a semiconductor layer can be employed; accordingly, a semiconductor integrated circuit having functions required for various applications can be provided.

There is no particular limitation on the methods by which the scanning line driver circuit and the display portion are provided as long as the scanning line driver circuit and the display portion are provided over a flexible substrate of the display panel. The scanning line driver circuit and the display portion may be formed directly on the flexible substrate. Alternatively, the scanning line driver circuit and the display portion may be formed on a formation substrate, and then only an element layer is transferred from the formation substrate to the flexible substrate by a separation method. For example, the scanning line driver circuit and the display portion can be formed on the formation substrate through the same process and transferred to the flexible substrate of the display panel. In that case, since the scanning line driver circuit and the display portion are formed through the same process, they are preferably formed using transistors having the same structure and material in the point of cost reduction. Therefore, channel layers of transistors included in the scanning line driver circuit and the display portion are formed using the same material.

Alternatively, transferring from a formation substrate to a flexible supporting substrate may be performed, and then the whole flexible supporting substrate may be attached to a substrate of the display panel. For example, a plurality of scanning line driver circuits may be formed over the formation substrate and transferred to the flexible supporting substrate, and then the plurality of scanning line driver circuits are separated individually with the flexible supporting substrate divided, and the scanning line driver circuit provided over the flexible supporting substrate may be attached as many as needed to one display panel. In that case, since the scanning line driver circuit and the display portion are formed through different processes, transistors having different structures and materials can be used.

The above transfer method and direct formation method may be combined. For example, a wiring for electrically connecting a display portion, a scanning line driver circuit, an FPC, and the like may be directly formed on a flexible substrate of the display panel by a printing method or the like.

The formation substrate may be selected as appropriate depending on the formation process of the element layer. For example, a glass substrate, a quartz substrate, a sapphire substrate, a ceramic substrate, or a metal substrate having an insulating layer on its surface can be used as the formation substrate. A plastic substrate having heat resistance to the processing temperature may be used as well.

As the flexible substrate, an aramid resin, a polyethylene naphthalate (PEN) resin, a polyether sulfone (PES) resin, a polyphenylene sulfide (PPS) resin, a polyimide (PI) resin, or the like can be used. A prepreg that is a structure body in which fiber is impregnated with an organic resin may be used as well.

There is no particular limitation on the method of transferring the element layer from the formation substrate to another substrate; a variety of methods can be used. For example, a separation layer may be formed between the formation substrate and the element layer.

In this specification, the element layer includes in its category, not only a semiconductor element layer provided on the element substrate side but also a counter electrode layer or the like provided on the counter substrate side. Accordingly, the separation step can be used for both the element substrate side and the sealing substrate side. Further, in view of the simplicity of the manufacturing process, the element layer is transferred from the formation substrate to the flexible substrate, and then the manufacturing process can proceed with the flexible substrate temporally attached to a glass substrate or the like.

The separation layer is formed to have a single-layer structure or a stacked-layer structure including a layer formed using an element such as tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), or silicon (Si); or an alloy material or a compound material containing any of the elements as its main component by a sputtering method, a plasma CVD method, a coating method, a printing method, or the like. A crystalline structure of a layer containing silicon may be any one of an amorphous structure, a microcrystalline structure, and a polycrystalline structure. The coating method includes a spin-coating method, a droplet discharge method, and a dispensing method in its category here.

In the case where the separation layer has a single-layer structure, it is preferable to form a tungsten layer, a molybdenum layer, or a layer containing a mixture of tungsten and molybdenum. Alternatively, a layer containing oxide or oxynitride of tungsten, a layer containing oxide or oxynitride of molybdenum, or a layer containing oxide or oxynitride of a mixture of tungsten and molybdenum may be formed. Note that the mixture of tungsten and molybdenum, for example, corresponds to an alloy of tungsten and molybdenum.

In the case where the separation layer has a stacked-layer structure, it is preferable to form, as a first layer, a tungsten layer, a molybdenum layer, or a layer containing a mixture of tungsten and molybdenum, and form, as a second layer, oxide, nitride, oxynitride, or nitride oxide of tungsten, molybdenum, or a mixture of tungsten and molybdenum.

In the case where the separation layer is formed to have a stacked-layer structure including a layer containing tungsten and a layer containing oxide of tungsten, the layer containing tungsten may be formed first and an insulating layer formed of oxide is formed thereover to form a layer containing oxide of tungsten at the interface between the tungsten layer and the insulating layer. Furthermore, the surface of the layer containing tungsten may be subjected to thermal oxidation treatment, oxygen plasma treatment, or treatment using a strong oxidizing solution such as ozone water to form a layer containing oxide of tungsten. Plasma treatment or heat treatment may be performed in an atmosphere of oxygen, nitrogen, or dinitrogen monoxide alone, or a mixed gas of the above gas and another gas. The same applies to the case of forming a layer containing nitride, oxynitride, or nitride oxide of tungsten: after the layer containing tungsten is formed, a silicon nitride layer, a silicon oxynitride layer, or a silicon nitride oxide layer may be formed thereover.

Note that for the step of transferring the element layer to another substrate, any of the following methods can be used as appropriate: a method in which a separation layer is formed between a substrate and an element layer, a metal oxide film is provided between the separation layer and the element layer, and the metal oxide film is embrittled by crystallization, thereby separating the element layer; a method in which an amorphous silicon film containing hydrogen is provided between a substrate having high heat resistance and an element layer, and the amorphous silicon film is removed by laser light irradiation or etching, thereby separating the element layer; a method in which a separation layer is formed between a substrate and an element layer, a metal oxide film is provided between the separation layer and the element layer, the metal oxide film is embrittled by crystallization, part of the separation layer is removed by etching using a solution or a fluoride halogen gas such as $NF_3$, $BrF_3$, or $ClF_3$, and then the element layer is separated at the embrittled metal oxide film; a method in which a substrate over which an element layer is formed is mechanically removed or is removed by etching using a solution or a fluoride halogen gas such as $NF_3$, $BrF_3$, or $ClF_3$; and the like. Alternatively, a method may be used in which a film containing nitrogen, oxygen, hydrogen, or the like (e.g., an amorphous silicon film containing hydrogen, an alloy film containing hydrogen, or an alloy film containing oxygen) is used as a separation layer, and the separation layer is irradiated with laser light to release nitrogen, oxygen, or hydrogen contained in the separation layer as a gas, thereby promoting separation between the element layer and the substrate.

Combination of the above separation methods makes it easier to perform the transferring step. In other words, separation can also be performed with physical force (e.g., by a machine or the like) after making it easier for the separation layer and the element layer to be separated by laser irradiation, etching of the separation layer with a gas or a solution, or mechanical removal of the separation layer with a sharp knife, scalpel, or the like.

The interface between the separation layer and the element layer may be permeated with a liquid, so that the element layer is separated from the substrate. Water or the like can be used as the liquid.

There is no particular limitation on the kind of thin film transistors included in the display device of the present invention. Accordingly, a variety of structures and semiconductor materials can be used for the transistors.

Examples of the structure of a thin film transistor is described using FIGS. 15A to 15D. FIGS. 15A to 15D illustrates examples of the thin film transistor which can be applied to the thin film transistor 4010 in Embodiment 5.

In FIGS. 15A to 15D, the insulating film 4023 is formed over the element substrate 4331, and thin film transistors 4010a, 4010b, 4010c, and 4010d are provided over the insulating film 4023. The insulating layers 4020 and 4021 are formed over each of the thin film transistors 4010a, 4010b, 4010c, and 4010d, and the first electrode layer 4030 is provided to be electrically connected to the thin film transistors 4010a, 4010b, 4010c, and 4010d.

The thin film transistor 4010a has a structure in which wiring layers 405a and 405b serving as a source and drain electrode layers are in contact with a semiconductor layer 403 without an $n^+$ layer interposed therebetween in the thin film transistor 4010 illustrated in FIGS. 12A and 12B.

The thin film transistor 4010a is an inverted-staggered thin film transistor in which a gate electrode layer 401, a gate insulating layer 402, the semiconductor layer 403, and the wiring layers 405a and 405b serving as a source and drain electrode layers are provided over the element substrate 4331 having an insulating surface and the insulating film 4023.

The thin film transistor 4010b is a bottom-gate thin film transistor in which the gate electrode layer 401, the gate insulating layer 402, the wiring layers 405a and 405b serving as a source and drain electrode layers, $n^+$ layers 404a and 404b serving as a source and drain regions, and the semiconductor layer 403 are provided over the element substrate 4331 having an insulating surface and the insulating film 4023. The $n^+$ layers 404a and 404b are semiconductor layers having lower resistance than the semiconductor layer 403. In addition, the insulating layer 4020 is provided in contact with the semiconductor layer 403 so as to cover the thin film transistor 4010b.

The $n^+$ layers 404a and 404b may be provided between the gate insulating layer 402 and the wiring layers 405a and 405b. The $n^+$ layers may be provided both between the gate insulating layer and the wiring layers and between the wiring layers and the semiconductor layer.

In the thin film transistor 4010b, the gate insulating layer 402 exists in the entire region including the thin film transistor 4010b, and the gate electrode layer 401 is provided between the gate insulating layer 402 and the element substrate 4331 having an insulating surface. The wiring layers 405a and 405b and the $n^+$ layers 404a and 404b are provided over the gate insulating layer 402. In addition, the semiconductor layer 403 is provided over the gate insulating layer 402, the wiring layers 405a and 405b, and the $n^+$ layers 404a and 404b. Although not shown, a wiring layer is provided over the gate insulating layer 402 in addition to the wiring layers 405a and 405b, and the wiring layer extends beyond the perimeter of the semiconductor layer 403.

The thin film transistor 4010c has a structure in which the source and drain electrode layers are in contact with the semiconductor layer without an $n^+$ layer interposed therebetween in the thin film transistor 4010b.

In the thin film transistor 4010c, the gate insulating layer 402 exists in the entire region including the thin film transistor 4010c, and the gate electrode layer 401 is provided between the gate insulating layer 402 and the element substrate 4331 having an insulating surface. The wiring layers 405a and 405b are provided over the gate insulating layer 402. In addition, the semiconductor layer 403 is provided over the gate insulating layer 402 and the wiring layers 405a and 405b. Although not shown, a wiring layer is provided over the gate insulating layer 402 in addition to the wiring layers 405a and 405b, and the wiring layer extends beyond the perimeter of the semiconductor layer 403.

The thin film transistor 4010d is a top-gate thin film transistor and an example of a planar thin film transistor. The semiconductor layer 403 including the $n^+$ layers 404a and 404b serving as a source and drain regions is formed over the element substrate 4331 having an insulating surface and the insulating film 4023. The gate insulating layer 402 is formed over the semiconductor layer 403, and the gate electrode layer 401 is formed over the gate insulating layer 402. In addition, the wiring layers 405a and 405b serving as a source and drain electrode layers are formed in contact with the $n^+$ layers 404a and 404b. The $n^+$ layers 404a and 404b are semiconductor layers having lower resistance than the semiconductor layer 403.

A top-gate forward-staggered thin film transistor may be used as the thin film transistor.

Although a single-gate structure is described in this embodiment, a multi-gate structure such as a double-gate structure may be used. In that case, a gate electrode layer may be provided above and below the semiconductor layer, or a plurality of gate electrode layers may be provided on one side of (above or below) the semiconductor layer.

There is no particular limitation on the semiconductor material used for the semiconductor layer. Examples of a material used for the semiconductor layer of the thin film transistor are described below.

As a material used for forming the semiconductor layer included in the semiconductor element, any of the following can be used: an amorphous semiconductor (hereinafter, also referred to as "AS") that is formed by a sputtering method or a vapor-phase growth method using a semiconductor material gas typified by silane or germane; a polycrystalline semiconductor that is obtained by crystallizing the amorphous semiconductor by utilizing light energy or thermal energy; a microcrystalline semiconductor (also referred to as a semi-amorphous or microcrystal semiconductor, and hereinafter, also referred to as "SAS"); and the like. The semiconductor layer can be deposited by a sputtering method, an LPCVD method, a plasma CVD method, or the like.

Considering Gibbs free energy, the microcrystalline semiconductor film is in a metastable state between an amorphous state and a single crystal state. In other words, the microcrystalline semiconductor is in a third state that is stable in free energy and has short-range order and lattice distortion. Columnar-like or needle-like crystals grow in the normal direction to the surface of the substrate. The Raman spectrum of microcrystalline silicon, which is a typical example of a microcrystalline semiconductor, is located in lower wave numbers than 520 cm$^{-1}$ that represents the peak of the Raman spectrum of single crystal silicon. In other words, the peak of the Raman spectrum of the microcrystalline silicon exists between 520 cm$^{-1}$ that represents that of single crystal silicon and 480 cm$^{-1}$ that represents that of amorphous silicon. In addition, the microcrystalline silicon contains hydrogen or halogen of at least 1 atomic % or more in order to terminate a dangling bond. Moreover, the microcrystalline silicon contains a rare gas element such as helium, argon, krypton, or neon to further promote lattice distortion, whereby a favorable microcrystalline semiconductor film with improved stability can be obtained.

This microcrystalline semiconductor film can be formed by a high-frequency plasma CVD method with a frequency of several tens of megahertz to several hundreds of megahertz, or a microwave plasma CVD apparatus with a frequency of 1 GHz or more. Typically, the microcrystalline semiconductor film can be formed with silicon hydride such as $SiH_4$, $Si_2H_6$, $SiH_2Cl_2$, $SiHCl_3$, $SiCl_4$, or $SiF_4$ and hydrogen which is added for dilution. Alternatively, the microcrystalline semiconductor film can be formed with, in addition to silicon hydride and hydrogen, one or more kinds of rare gas elements selected from helium, argon, krypton, and neon which is added for dilution. In such a case, the flow rate ratio of hydrogen to silicon hydride is set to 5:1 to 200:1, preferably 50:1 to 150:1, and more preferably 100:1

Hydrogenated amorphous silicon is given as a typical example of an amorphous semiconductor, and polysilicon and the like are given as typical examples of a crystalline semiconductor. Polysilicon (polycrystalline silicon) includes so-called high-temperature polysilicon that contains, as its main component, polysilicon formed at a process temperature of 800° C. or higher, so-called low-temperature polysilicon that contains, as its main component, polysilicon formed at a process temperature of 600° C. or lower, and polysilicon formed by crystallizing amorphous silicon by using an element which promotes crystallization, or the like. As described above, a microcrystalline semiconductor or a semiconductor partially including a crystalline phase can be used as well.

As the semiconductor material, a compound semiconductor such as GaAs, InP, SiC, ZnSe, GaN, or SiGe can be used as well as silicon (Si) or germanium (Ge) alone.

In the case of using a crystalline semiconductor film as the semiconductor layer, the crystalline semiconductor film may be formed by any of a variety of methods (e.g., laser crystallization, thermal crystallization, or thermal crystallization using an element such as nickel which promotes crystallization). A microcrystalline semiconductor that is SAS may be crystallized by laser irradiation, so that crystallinity thereof can be enhanced. In the case where an element which promotes crystallization is not added, an amorphous silicon film is heated at 500° C. for one hour in a nitrogen atmosphere before being irradiated with laser light, whereby hydrogen contained in the amorphous silicon film is released to a concentration of 1×10$^{20}$ atoms/cm$^3$ or less. This is because, if the amorphous silicon film contains a large amount of hydrogen, the amorphous silicon film would be destroyed by laser light irradiation.

There is no particular limitation on the method of adding a metal element into the amorphous semiconductor film as long as the metal element can exist in the surface of or inside the amorphous semiconductor film. For example, a sputtering method, a CVD method, a plasma treatment method (e.g., a plasma CVD method), an adsorption method, or a method of applying a metal salt solution can be used. Among these, the method using a solution is useful in terms of easy adjustment of the concentration of the metal element. At this time, an oxide film is preferably deposited by UV light irradiation in an oxygen atmosphere, thermal oxidation, treatment with ozone water or hydrogen peroxide including a hydroxyl radical, or the like in order to improve the wettability of the surface of the amorphous semiconductor film and to spread an aqueous solution on the entire surface of the amorphous semiconductor film.

In a crystallization step for crystallizing the amorphous semiconductor film to form a crystalline semiconductor film, an element which promotes crystallization (also referred to as a catalytic element or a metal element) may be added to the amorphous semiconductor film, and crystallization may be performed by heat treatment (at 550° C. to 750° C. for 3 minutes to 24 hours). As the element which promotes (accelerates) the crystallization, one or more kinds of elements selected from iron (Fe), nickel (Ni), cobalt (Co), ruthenium (Ru), rhodium (Rh), palladium (Pd), osmium (Os), iridium (Ir), platinum (Pt), copper (Cu), and gold (Au) can be used.

In order to remove or reduce the element which promotes crystallization from the crystalline semiconductor film, a semiconductor film containing an impurity element is formed in contact with the crystalline semiconductor film so as to function as a gettering sink. As the impurity element, an impurity element imparting n-type conductivity, an impurity element imparting p-type conductivity, a rare gas element, or the like can be used. For example, it is possible to use one or more kinds of elements selected from phosphorus (P), nitrogen (N), arsenic (As), antimony (Sb), bismuth (Bi), boron (B), helium (He), neon (Ne), argon (Ar), krypton (Kr), and xenon (Xe). A semiconductor film containing a rare gas element is formed in contact with the crystalline semiconductor film containing the element which promotes crystallization, and then heat treatment is performed (at 550° C. to 750° C. for 3 minutes to 24 hours). The element promoting crystallization that is contained in the crystalline semiconductor film moves into the semiconductor film containing a rare gas element, and thus the element promoting crystallization which is contained in the crystalline semiconductor film is removed or reduced. After that, the semiconductor film containing a rare gas element which functions as a gettering sink is removed.

The amorphous semiconductor film may be crystallized by a combination of thermal treatment and laser light irradiation. Either one of thermal treatment and laser light irradiation may be performed plural times.

A crystalline semiconductor film may be formed directly over the substrate by a plasma method. A crystalline semiconductor film may be selectively formed over the substrate by a plasma method.

An oxide semiconductor may be used for the semiconductor layer. For example, zinc oxide (ZnO), tin oxide ($SnO_2$), or the like can be used. In the case of using ZnO for the semiconductor layer, $Y_2O_3$, $Al_2O_3$, or $TiO_2$, a stacked layer thereof, or the like can be used for a gate insulating layer, and ITO, Au, Ti, or the like can be used for a gate electrode layer, a source electrode layer, and/or a drain electrode layer. In addition, In, Ga, or the like may be added to ZnO.

As the oxide semiconductor, a thin film represented by $InMO_3(ZnO)_m$ (m>0) can be used. Here, M denotes one or more of metal elements selected from gallium (Ga), iron (Fe), nickel (Ni), manganese (Mn), and cobalt (Co). For example, M is gallium (Ga) in some cases, and in other cases, M contains other metal elements in addition to Ga, such as Ga and Ni or Ga and Fe. Furthermore, the above oxide semiconductor may contain a transition metal element such as Fe or Ni or an oxide of the transition metal as an impurity element in addition to a metal element contained as M. For example, an In—Ga—Zn—O-based non-single-crystal film can be used as the oxide semiconductor layer.

As the oxide semiconductor layer (the $InMO_3(ZnO)_m$ (m>0) film), an $InMO_3(ZnO)_m$ film (m>0) in which M is another metal element may be used instead of the In—Ga—Zn—O-based non-single-crystal film. As the oxide semiconductor which is applied to the oxide semiconductor layer, any of the following oxide semiconductors can be applied as well as the above: an In—Sn—Zn—O based oxide semiconductor; an In—Al—Zn—O based oxide semiconductor; a Sn—Ga—Zn—O based oxide semiconductor; an Al—Ga—Zn—O based oxide semiconductor; a Sn—Al—Zn—O based oxide semiconductor; an In—Zn—O based oxide semiconductor; a Sn—Zn—O based oxide semiconductor; an Al—Zn—O based oxide semiconductor; an In—O based oxide semiconductor; a Sn—O based oxide semiconductor; and a Zn—O based oxide semiconductor.

Embodiment 5 can be implemented in appropriate combination with any structures described in the other embodiments.

This application is based on Japanese Patent Application Ser. No. 2009-112378 filed with Japan Patent Office on May 2, 2009, the entire contents of which are hereby incorporated by reference.

What is claimed is:

1. A display device comprising:
    a flexible display panel comprising a scanning line driver circuit and a display portion including a light-emitting element;
    a flexible printed circuit attached to a first portion of the flexible display panel;
    an IC mounted on the flexible printed circuit; and
    a supporting portion in which the flexible printed circuit and the IC are provided,
    wherein the flexible display panel comprises a stress concentration region between the display portion and the first portion of the flexible display panel,
    wherein each of the IC and the stress concentration region is provided along a first direction in which the flexible display panel is bent, and
    wherein the scanning line driver circuit comprises a region provided along a second direction perpendicular to the first direction.

2. The display device according to claim 1,
    wherein the flexible display panel comprises an element substrate and a sealing substrate, and
    wherein the stress concentration region is provided in the sealing substrate.

3. The display device according to claim 1, wherein the stress concentration region comprises a cut portion in the flexible display panel.

4. The display device according to claim 1, wherein the supporting portion is provided along an end portion of the flexible display panel.

5. The display device according to claim 1, wherein the supporting portion is more rigid than the flexible display panel.

6. The display device according to claim 1, wherein the stress concentration region is provided outside the supporting portion.

7. The display device according to claim 1, wherein the IC comprises a signal line driver circuit.

8. The display device according to claim 1, further comprising a printed board electrically connected to the flexible printed circuit and in contact with the supporting portion.

9. A display device comprising:
    a flexible display panel comprising a scanning line driver circuit and a display portion including a light-emitting element;
    a flexible printed circuit attached to a first portion of the flexible display panel;
    an IC mounted on a second portion of the flexible display panel that is between the display portion and the first portion; and
    a supporting portion in which the flexible printed circuit and the IC are provided,
    wherein the flexible display panel comprises a stress concentration region between the display portion and the first portion of the flexible display panel,
    wherein each of the IC and the stress concentration region is provided along a first direction in which the flexible display panel is bent, and
    wherein the scanning line driver circuit comprises a region provided along a second direction perpendicular to the first direction.

10. The display device according to claim 9,
    wherein the flexible display panel comprises an element substrate and a sealing substrate, and
    wherein the stress concentration region is provided in the sealing substrate.

11. The display device according to claim 9, wherein the stress concentration region comprises a cut portion in the flexible display panel.

12. The display device according to claim 9, wherein the supporting portion is provided along an end portion of the flexible display panel.

13. The display device according to claim 9, wherein the supporting portion is more rigid than the flexible display panel.

14. The display device according to claim 9, wherein the stress concentration region is provided outside the supporting portion.

15. The display device according to claim 9, wherein the IC comprises a signal line driver circuit.

16. The display device according to claim 9, further comprising a printed board electrically connected to the flexible printed circuit and in contact with the supporting portion.

* * * * *